US012655018B2

(12) United States Patent
Classen

(10) Patent No.: US 12,655,018 B2
(45) Date of Patent: Jun. 16, 2026

(54) METHOD FOR PRODUCING A MICROELECTROMECHANICAL COMPONENT

(71) Applicant: Robert Bosch GmbH, Stuttgart (DE)

(72) Inventor: Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 347 days.

(21) Appl. No.: 18/525,410

(22) Filed: Nov. 30, 2023

(65) Prior Publication Data

US 2024/0182298 A1 Jun. 6, 2024

(30) Foreign Application Priority Data

Dec. 5, 2022 (DE) ..................... 10 2022 213 052.9

(51) Int. Cl.
B81C 1/00 (2006.01)

(52) U.S. Cl.
CPC .. B81C 1/00619 (2013.01); *B81C 2201/0132* (2013.01); *B81C 2201/0198* (2013.01); *B81C 2203/0785* (2013.01)

(58) Field of Classification Search
CPC ... B81C 1/00; B81C 1/00325; B81C 1/00619; B81C 2201/0132; B81C 2201/0198; B81C 2203/0785; B81B 2201/0235; B81B 2201/0242; B81B 2201/0264
See application file for complete search history.

(56) References Cited

U.S. PATENT DOCUMENTS

2016/0090303 A1* 3/2016 Zinn ................... B81C 1/00246
438/53
2016/0221822 A1* 8/2016 Krumbein .............. H04R 19/04

FOREIGN PATENT DOCUMENTS

DE 102009045385 A1 4/2011
DE 102013206328 A1 10/2014
DE 102013216901 A1 2/2015
DE 102014202801 A1 8/2015
DE 102017207111 A1 10/2018
DE 102019219476 A1 6/2021
WO WO-2018054470 A1 * 3/2018 ......... B81C 1/00238

* cited by examiner

*Primary Examiner* — Brook Kebede
(74) *Attorney, Agent, or Firm* — NORTON ROSE FULBRIGHT US LLP

(57) ABSTRACT

A method producing a microelectromechanical component. A dielectric layer is structured on an upper side of a substrate forming a grating, and a blind hole is formed beneath the grating. A cover layer is arranged on the dielectric layer closing the blind hole. A layer sequence is arranged on the cover layer and above the blind hole. Functional structures are formed in the layer sequence and an access channel extending through the layer sequence to the blind hole is formed. A further substrate is connected to the substrate. The functional structures are enclosed in a cavity, connected to the blind hole, between the substrate and the further substrate. Another blind hole is formed on an underside of the substrate. The blind hole is opened in the region of the other blind hole. A cavity internal pressure is set, and the blind hole is closed.

12 Claims, 21 Drawing Sheets

METHOD FOR PRODUCING A MICROELECTROMECHANICAL COMPONENT

CROSS REFERENCE

The present application claims the benefit under 35 U.S.C. § 119 of German Patent Application No. DE 10 2022 213 052.9 filed on Dec. 5, 2022, which is expressly incorporated herein by reference in its entirety.

FIELD

The present invention relates to a method for producing a microelectromechanical component.

BACKGROUND INFORMATION

Microelectromechanical sensors (MEMS) for measuring, for example, acceleration, yaw rate, pressure and other physical variables are mass-produced for various applications in the automotive and consumer sectors. An important trend in the further development of sensors is the increase in functionality or an improved functional integration that enables more functionality while maintaining or even decreasing installation space. This includes, for example, the arrangement of sensor elements for measuring different physical variables on a chip. A known example of this is the arrangement of a yaw rate sensor and an acceleration sensor on the same chip. For the operation of such a MEMS component, the sensitive sensor elements must be capped by wafer-bonding methods with a cap wafer for protection against environmental influences.

One of the challenges with combined yaw rate and acceleration sensors lies in the different preferred internal pressures at which the sensors are to be operated. Ideally, a yaw rate sensor is operated at a good vacuum, typically at a pressure of 0.1-2 mbar, while an acceleration sensor should be at least critically damped and therefore typically should be operated at internal pressures in the range of 30-1000 mbar, for example at 100 mbar. The simultaneous operation of a yaw rate and acceleration sensor on a chip therefore suggests forming two separate cavity regions with different internal pressures in a hermetically capped chip.

In some conventional methods, after wafer bonding or closure by means of thin-film capping, one of the cavities is opened, a suitable internal pressure is set, and the cavity is then closed again. In this case, it is possible either to first close the cavities at low internal pressure and then to open the acceleration sensor cavity, to apply a high internal pressure and then to close it, or, after the initial closure to open the yaw rate sensor cavity at high internal pressure, to evacuate it and close it at a low internal pressure. The closure can be effected, for example, via thin-film deposition, deposition of an oxide or metal, or even via a so-called laser reseal, in which a surrounding region around an access hole and close to the surface is melted locally by local heat input by means of a laser, and the access hole is thus closed.

A further example for improved functional integration are methods of vertical integration, in which a MEMS wafer is connected or bonded to an ASIC (application-specific integrated circuit) wafer using a metallic bonding method, wherein the ASIC represents the electronic evaluation circuit and at the same time the hermetic cap for the MEMS element (so-called ASICap components). These vertical integration methods in combination with through-silicon vias (TSVs) and flip-chip technologies are particularly attractive, whereby a structure and contacting can be implemented as a chip-scale package.

The application of laser reseal is significantly more difficult in the case of ASICap components, since the functional ASIC forms the cap for the MEMS base chip. German Patent Application No. DE 10 2019 219 476 A1 describes a process sequence in which ventilation access into the sensor cavity and the subsequent closure in the ASIC take place. The process sequence includes several technical challenges. On the one hand, a complete stack of dielectrics on the front side of the ASIC has to be removed at the location where the access hole is to be formed; depending on the nature of the layers, this can be a lengthy and correspondingly cost-intensive process. Furthermore, an access hole has to be cut through the ASIC from the rear side and then closed by laser reseal, without cracking or plasma-induced damage occurring in the ASIC functional layers. The laser reseal also creates a surface generally not free of topography.

As an alternative, a sealing by the MEMS substrate wafer has therefore been described in German Patent Application No. DE 10 2014 202 801 A1. However, this does not address the problem that closure in the case of laser reseal functions best with relatively small access holes (e.g., 5-10 μm), but a comparatively thick MEMS substrate of 300 μm or more with a correspondingly small access hole cannot be opened over the entire depth. The etching rate of the trench etch process, for example in the case of deep reactive ion etching, markedly breaks down in extremely narrow channels, and at some point even comes to a complete standstill, since a side-wall passivation applied in the trench etch process at the bottom of the channel can no longer be opened.

A fundamental problem with ASICap components, such as a yaw rate sensor, which are to be operated with low internal pressure is the small volume of the sensor cavity, since a gap of only a few micrometers is formed between MEMS and ASIC. Due to the small volume, the internal pressure in the cavity increases rapidly if, for example, there is outgassing from the ASIC wafer or from other sources in the cavity. For example, it is known that in the case of ASIC wafers with complementary metal oxide semiconductor structures (CMOS) a large amount of hydrogen is stored during production in the dielectric passivation layers (which isolate the individual metal planes from one another) due to the use of plasma-enhanced chemical vapor deposition (PECVD). This can outgas to a certain extent during the service life of the MEMS component. The resulting pressure rise in the cavity can impair the performance of the MEMS component or even lead to total failure. It is therefore desirable to provide an enlarged cavity volume since, with the same amount of outgassing, the resulting rise in internal pressure in the sensor cavity will be lower in accordance with the ideal gas law.

SUMMARY

An object of the present invention is to provide an improved method for producing a microelectromechanical component. This object may be achieved by methods for producing a microelectromechanical component having features of the present invention. Advantageous developments of the present invention are disclosed herein.

According to an example embodiment of the present invention, a method for producing a microelectromechanical component comprises the following method steps. A dielectric layer is arranged on an upper side of a first substrate. The dielectric layer is structured, wherein a grating with grating openings extending to the upper side of the first substrate is formed in the dielectric layer. A material of the first substrate is removed in the region below the grating, whereby a first blind hole is formed in the upper side of the first substrate. The grating thereby remains above the first blind hole. A cover layer is arranged on a side of the dielectric layer facing away from the first substrate, whereby the first blind hole is closed. A layer sequence is arranged on a side of the cover layer facing away from the first substrate and above the closed first blind hole. Functional structures of the microelectromechanical component are formed and exposed by structuring the layer sequence. In addition, an access channel extending through the layer sequence to the first blind hole is formed. A second substrate is arranged on a side of the layer sequence facing away from the first substrate, and the first substrate and the second substrate are connected to one another. The functional structures of the microelectromechanical component are enclosed in a cavity formed between the first substrate and the second substrate. The cavity is connected to the first blind hole via the access channel. A second blind hole is formed on an underside of the first substrate opposite the upper side of the first substrate, and the first blind hole is opened in the region of the second blind hole. A cavity internal pressure in the cavity is set, and the first blind hole is closed in the region of the second blind hole.

By using a grating during the formation of the first blind hole, a width of the first blind hole can advantageously be selected to be comparatively high, for example in the range of from 8 μm to 30 μm, but not limited thereto, since after the formation of the first blind hole the grating remains above the first blind hole and in this way enables a reliable closure of a wide first blind hole. A great depth of the first blind hole, for example in the range of 100 μm to 400 μm but also not limited to the specified value range, can thereby also be achieved. Advantageously, the formation of the second blind hole for opening the first blind hole from the underside of the substrate can thereby be kept particularly short, i.e., extending only over a comparatively small depth of the second blind hole. A further advantage of the fact that the second blind hole does not have to be particularly deep is that a deep second blind hole has the disadvantage that, after the first blind hole has been closed, particles and dirt could easily collect in the second blind hole during further processing of the microelectromechanical component, which particles and dirt cannot be easily removed. A second blind hole with a shallow depth thus simplifies the subsequent further processing. For example, the stacking of a plurality of microelectromechanical components or of the microelectromechanical component with other components can also be facilitated.

One of the challenges of the process sequence described above can be that a width of the first blind hole must be selected to be relatively large in order to enable a sufficient depth of the first blind hole, but that, for example, the closing of the first blind hole works by means of laser reseal functions more reliably, in particular with small access openings. For this reason, when choosing the width of the first blind hole, a suitable balance must be found between the requirements of a front-side trench etch process (required depth of the first blind hole) and the requirements of laser reseal. Blind hole widths of, for example, 8-20 μm represent a good compromise for this; for deep blind holes of more than 300 μm, even up to 30 μm can be required for the width of the first blind hole.

This lowering of the closure region of the first blind hole on the underside of the first substrate within the second blind hole advantageously ensures that, in the case of laser reseal, solidified material, for instance silicon, does not protrude from the underside of the first substrate in the form of spikes and fine needles. As a result, handling the microelectromechanical component would be made more difficult and reliability would also be jeopardized due to mechanical loads on the closure during further processing.

In one example embodiment of the present invention, the first blind hole is opened by the second blind hole being designed such that it extends from the underside of the first substrate at least to the first blind hole. In this case, the first blind hole is thus opened by the formation of the second blind hole. An access to the cavity is thereby created in the region of the underside of the first substrate.

In one example embodiment of the present invention, the first blind hole is designed such that it tapers toward the underside of the first substrate. Advantageously, the first blind hole can thereby be designed to be particularly deep, wherein at the same time a bottom area of the first blind hole can be particularly small. The access to the open first blind hole can thereby be designed to be particularly small. This can simplify the closing of the first blind hole, which can be effected, for example, by means of laser reseal.

In one example embodiment of the present invention, the first blind hole is opened by the formation of a through-opening extending between the second blind hole and the first blind hole. Advantageously, an opening area of the through-opening can be particularly small, in particular smaller than an opening area of the first blind hole and smaller than an opening area of the second blind hole. The closing of the first blind hole can thereby be simplified, in particular if the closing takes place by means of laser reseal.

In one example embodiment of the present invention, the second blind hole has a smaller opening area than the first blind hole. As a result, the first blind hole can be closed, advantageously directly or almost at the underside of the second substrate. In another embodiment, the second blind hole has a larger opening area than the first blind hole. In this case, the first blind hole is closed in the region of the bottom of the second blind hole.

In one example embodiment of the present invention, the first substrate is planarized on the underside. The planarization can comprise grinding and/or polishing, in particular a chemical-mechanical polishing (CMP), of the substrate. The planarization can already be carried out completely or partially before the formation of the second blind hole and/or completely or partially after the closure of the first blind hole. After the first blind hole has been closed, planarization can be carried out, for example, up to the bottom of the second blind hole. As a result, any topography on the underside of the first substrate can advantageously be prevented, which simplifies the further processing of the microelectromechanical component. However, the planarization can also be carried out, for example, in such a way that a remaining depth of the second blind hole is less than a depth of the first blind hole. In this case, the microelectromechanical component has only a low topography on its underside, which advantageously simplifies further processing.

In one example embodiment of the present invention, the second substrate has on a side facing the layer sequence an application-specific integrated circuit for operating the microelectromechanical component. The full area of the ASIC can advantageously be used for circuit elements, since access to the cavity is not provided by the second substrate, but rather by the first substrate.

In one example embodiment of the present invention, the dielectric layer is structured such that at least one further grating with further grating openings extending to the upper side of the first substrate is formed in the upper side of the first substrate. The material of the first substrate is removed in the region below the at least one further grating, whereby at least one further first blind hole is formed in the upper side of the first substrate. The further grating remains above the further first blind hole. The further first blind hole is closed by the arrangement of the cover layer. The layer sequence is arranged above the closed further first blind hole. A further access channel extending through the layer sequence to the further first blind hole is formed. The cavity is connected to the further first blind hole via the further access channel.

The further first blind hole is not opened during reverse side processing, due to a further second blind hole being provided. However, the further first blind hole has a gas access to the cavity. The further first blind hole advantageously has the function of enlarging a cavity volume in order to make the microelectromechanical component less sensitive to outgassing effects. A plurality of such further first blind holes can be provided, which are buried in the substrate in order to achieve a significant increase in the volume of the cavity.

In one example embodiment of the present invention, a plurality of further first blind holes arranged laterally next to one another is formed in the upper side of the first substrate. The further first blind holes are each laterally expanded in regions between the upper side of the first substrate and corresponding bottoms of the further first blind holes in such a way that a contiguous hollow space is formed in the interior of the first substrate. In one embodiment, the further first blind holes are formed by means of an isotropic etching process. The further first blind holes are expanded by means of an anisotropic etching process.

In one example embodiment of the present invention, the functional structures of the microelectromechanical component are formed and exposed in a region above the hollow space. Arrangements in which the functional structures of the microelectromechanical component are thus not connected to the substrate can advantageously be created with this process sequence. In this way, an effective stress decoupling can be achieved with respect to mechanical stress which can be transmitted to the first substrate. This can be advantageous in order to improve a performance of the MEMS component, e.g., sensitivity and offset errors of yaw rate sensors, acceleration sensors and pressure sensors can be reduced in this way.

In one example embodiment of the present invention, the dielectric layer is structured such that at least one additional grating with additional grating openings extending to the upper side of the first substrate is formed in the upper side of the first substrate. The material of the first substrate is removed in the region beneath the at least one additional grating, whereby at least one additional first blind hole is formed in the upper side of the first substrate. The additional grating remains above the further first blind hole. The additional first blind hole is closed by the arrangement of the cover layer. The layer sequence is arranged above the closed additional first blind hole. Additional functional structures of the microelectromechanical component are formed and exposed by structuring the layer sequence. An additional access channel extending through the layer sequence to the additional first blind hole is formed. The additional functional structures of the microelectromechanical component are enclosed in an additional cavity that is formed separate from the cavity and between the first substrate and the second substrate. The additional cavity is connected to the additional first blind hole via the additional access channel.

An additional second blind hole is formed in the underside of the first substrate and the additional first blind hole is opened in the region of the additional second blind hole. An additional cavity internal pressure in the additional cavity is set. The additional first blind hole is closed in the region of the additional second blind hole.

It is thus advantageously possible not only to form a cavity in the MEMS component, but also for example a plurality of cavity regions separated from one another by means of a bonding frame, which can, for example, be opened in parallel and sequentially closed. Here, a defined internal pressure and a defined gas type can be used in each of the cavity regions, wherein internal pressure and/or gas type can differ from one another in the different cavities.

An example method according to the present invention for producing a microelectromechanical component is explained in more detail below in conjunction with schematic figures.

DETAILED DESCRIPTION OF EXAMPLE EMBODIMENTS

Figure 7:
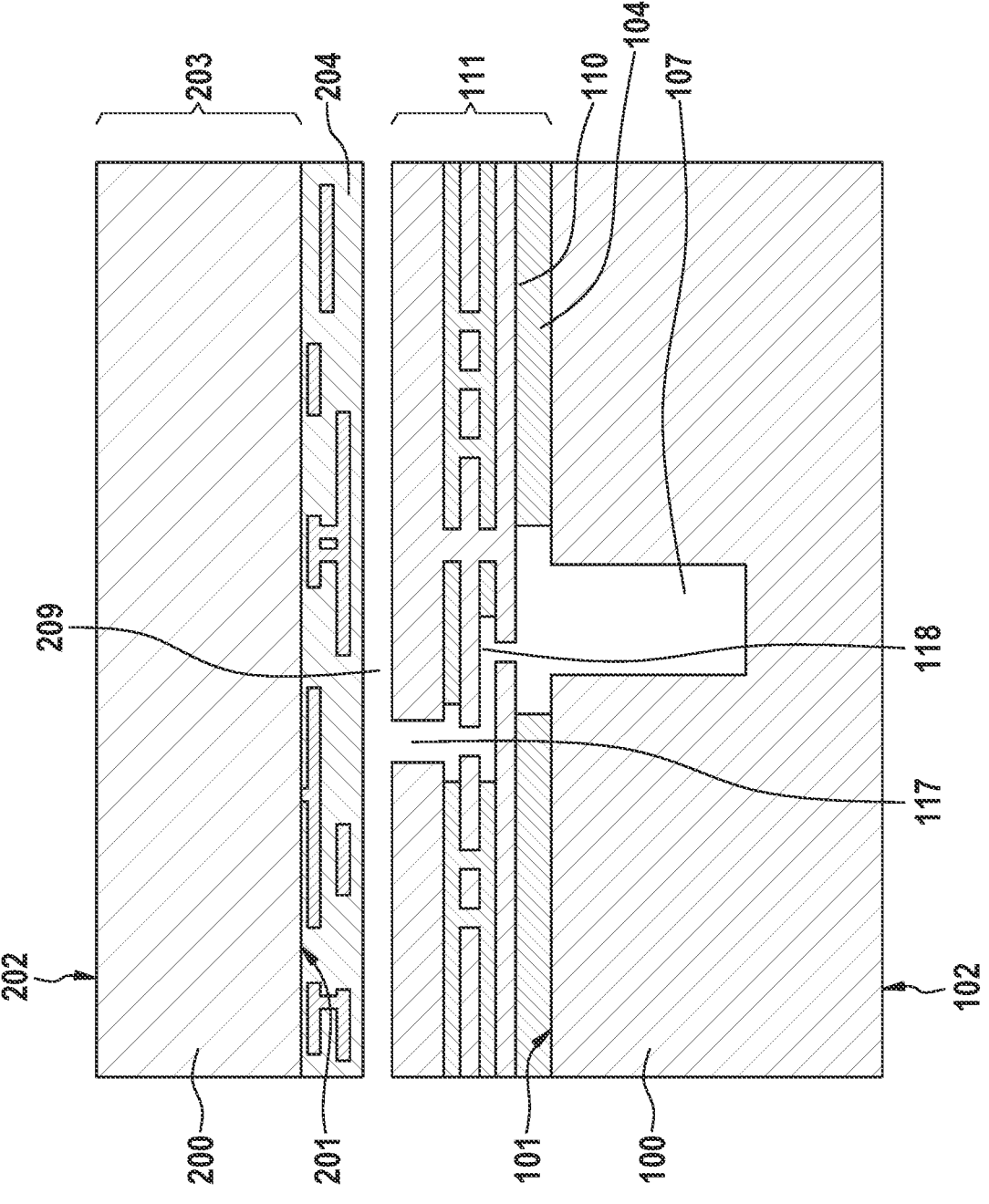
Figure 8:
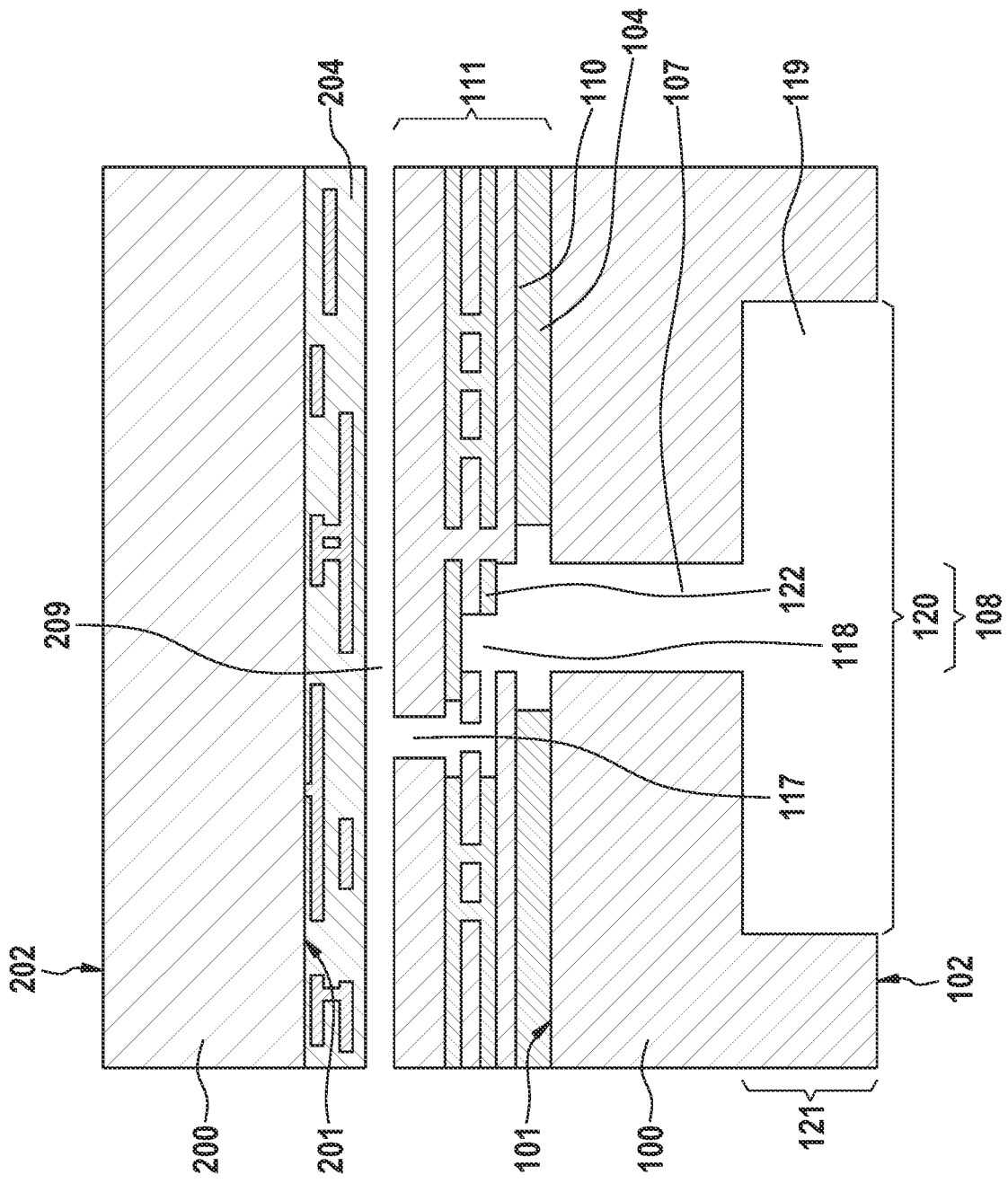
Figure 9:
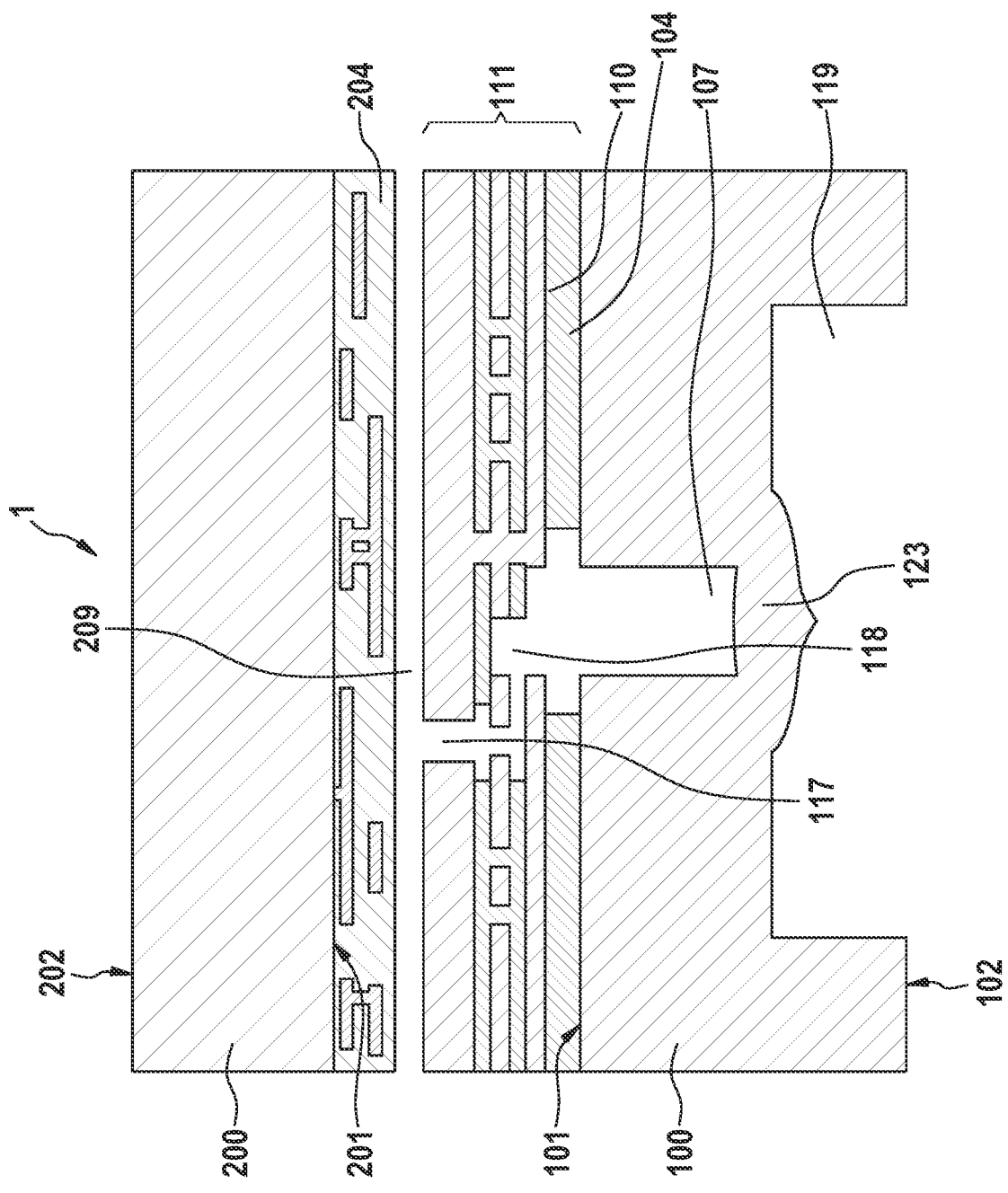

FIGS. 1 to 10 schematically show temporally successive states of a microelectromechanical component 1—hereinafter also referred to as MEMS component 1—in the context of a production method according to a first embodiment, wherein the finished memory device 1 is shown in FIG. 9. The MEMS component 1 is preferably a MEMS sensor or actuator. Particularly preferably, the MEMS component 1 is a yaw rate sensor, an acceleration sensor, a pressure sensor or a combined sensor covering the measurement variables mentioned. Cross-sectional views are shown in each case in FIGS. 1 to 10, wherein in each case only a small subregion of the MEMS component 1 is shown.

Figure 1:
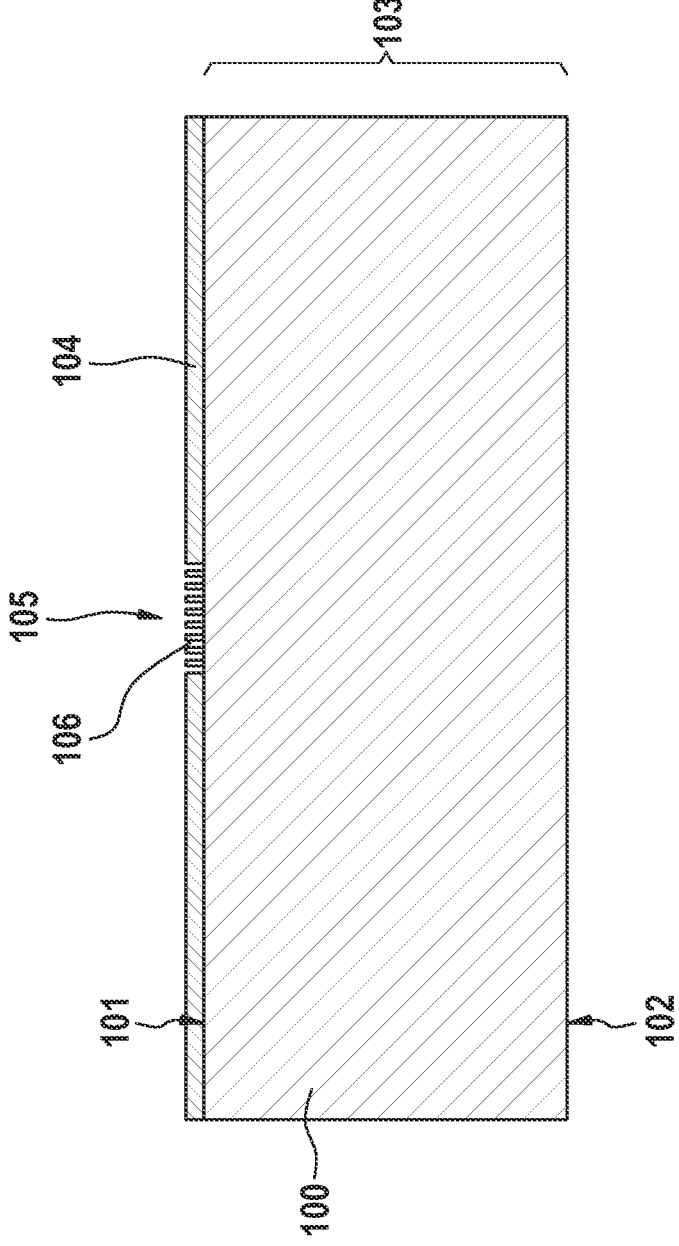
FIG. 1 to FIG. 10 show method steps of a method for producing a microelectromechanical component according to a first example embodiment of the present invention.

FIG. 1 shows a first state within the context of the method. A dielectric layer 104 was arranged on an upper side 101 of a first substrate 100. By way of example, the first substrate 100 comprises silicon and can be designed, for example, as a wafer. However, the first substrate 100 can also comprise a different material, such as a different semiconductor or a composite semiconductor. The first substrate 100 is planar, has an underside 102 opposite the upper side 101 and a thickness 103 measured perpendicular to the upper side 101. The dielectric layer 104 comprises silicon oxide by way of example. However, the dielectric layer 104 may also comprise a different dielectric material.

FIG. 1 further shows that the dielectric layer 104 was structured. A grating 105 with grating openings 106 extending to the upper side 101 of the first substrate 100 has thereby been formed in the upper side 101 of the first substrate 100. The upper side 101 of the first substrate 100 is accessible through the grating openings 106 in the dielectric layer 104.

Figure 2:
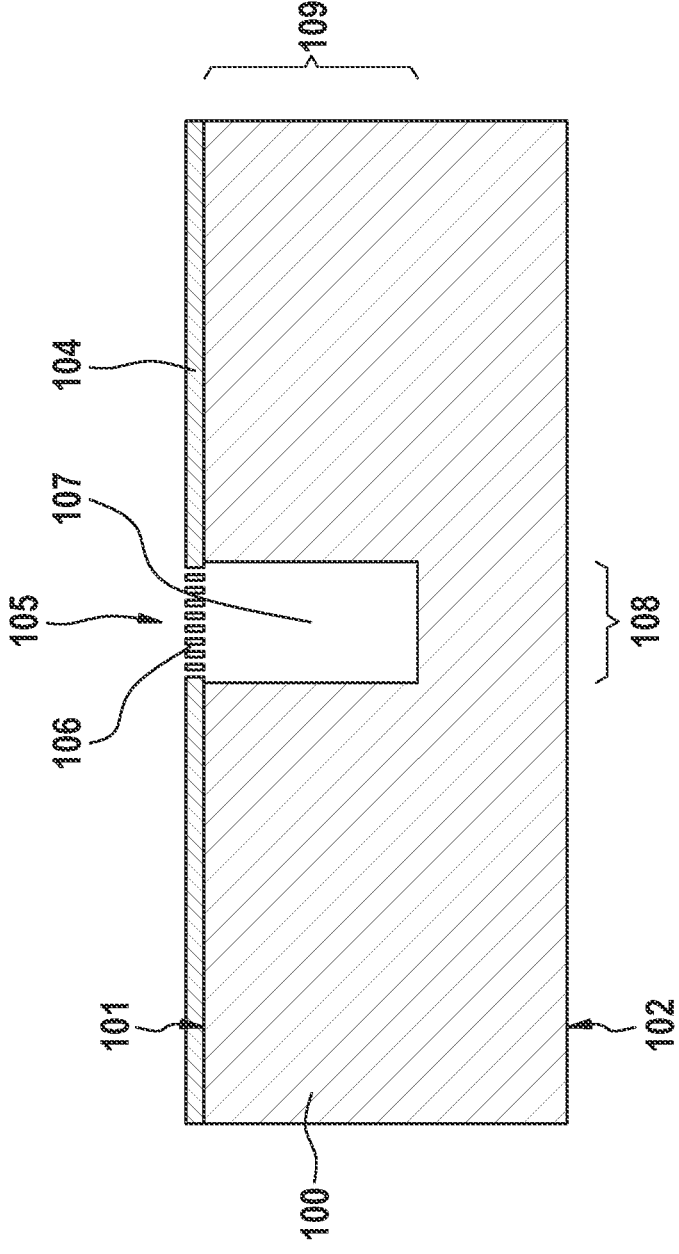

FIG. 2 shows a state temporally subsequent to FIG. 1. Similar or identical elements are provided with the same reference signs. The material of the first substrate 100 was removed in the region below the grating 105 such that a first blind hole 107 is formed in the upper side 101 of the first substrate 100. The first blind hole 107 has a width 108 measured parallel to the upper side 101 of the first substrate 100 and a depth 109 measured perpendicular to the upper side 101. The width 108 can, for example, have a value from the value range 8 μm to 30 μm. The depth 109 can, for example, have a value from the value range 100 μm to 400 μm. However, both the width 108 and the depth 109 are not limited to the specified value ranges. The grating 105 remains above the first blind hole 107 after the formation of the first blind hole 107.

Figure 3:
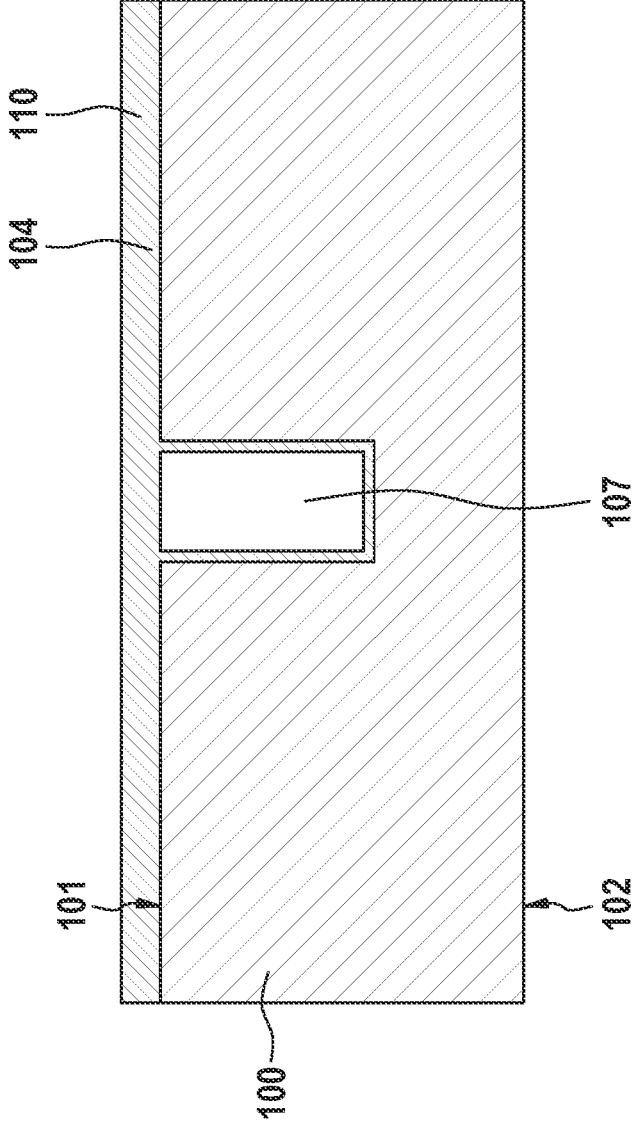

FIG. 3 shows a state temporally subsequent to FIG. 2. Similar or identical elements are provided with the same reference signs. A cover layer 110 was arranged on a side of the dielectric layer 104 facing away from the first substrate 100. By way of example, the cover layer 110 comprises silicon oxide, like the dielectric layer 104, but this is not absolutely necessary. The cover layer 110 can, for example, comprise a different oxide or a different dielectric material. In the exemplary embodiment, the dielectric layer 104 and the cover layer 110 form a contiguous layer since they comprise the same material.

The provision of the grating 105 in the dielectric layer 104 makes it possible to form a particularly wide first blind hole 107, since the grating openings 106 can be closed by the cover layer 110 being arranged before the first blind hole 107 is filled with the material of the cover layer 110. For this to succeed, the grating openings 106 should be small enough to be closed by the arrangement of the cover layer 110. However, the grating openings 106 in the dielectric layer 104 should be large enough to achieve a great depth 109 of the first blind hole 107 in the first substrate 100 when the first blind hole 107 is applied, which can be done, for example, by means of a trench etch process. As a result, a buried deep first blind hole 107 is formed with a substantially topography-free surface of the cover layer 110, so that subsequent surface-micromechanical processes can be carried out without problems.

Figure 4:
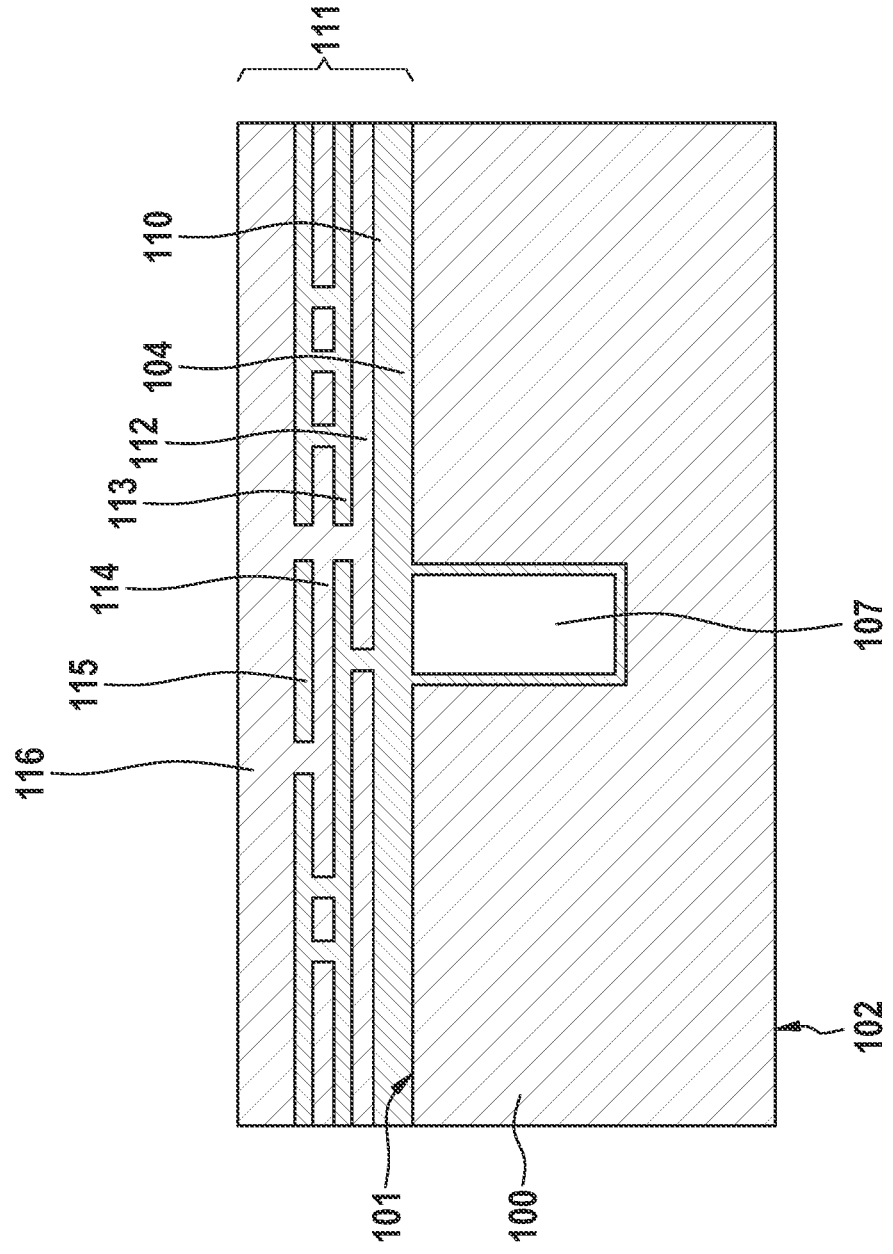

FIG. 4 shows a state temporally subsequent to FIG. 3. Similar or identical elements are provided with the same reference signs. A layer sequence 111 was arranged on a side of the cover layer 110 facing away from the first substrate 100 and above the closed first blind hole 107. By way of example, the layer sequence 111 has an alternating sequence of functional layers 112, 114, 116, which in each case comprise, for example, polycrystalline silicon, and further dielectric layers 113, 115, which comprise, for example, silicon oxide and/or silicon nitride. Alternatively or additionally, other materials can also be used for the layer sequence 111.

Figure 5:
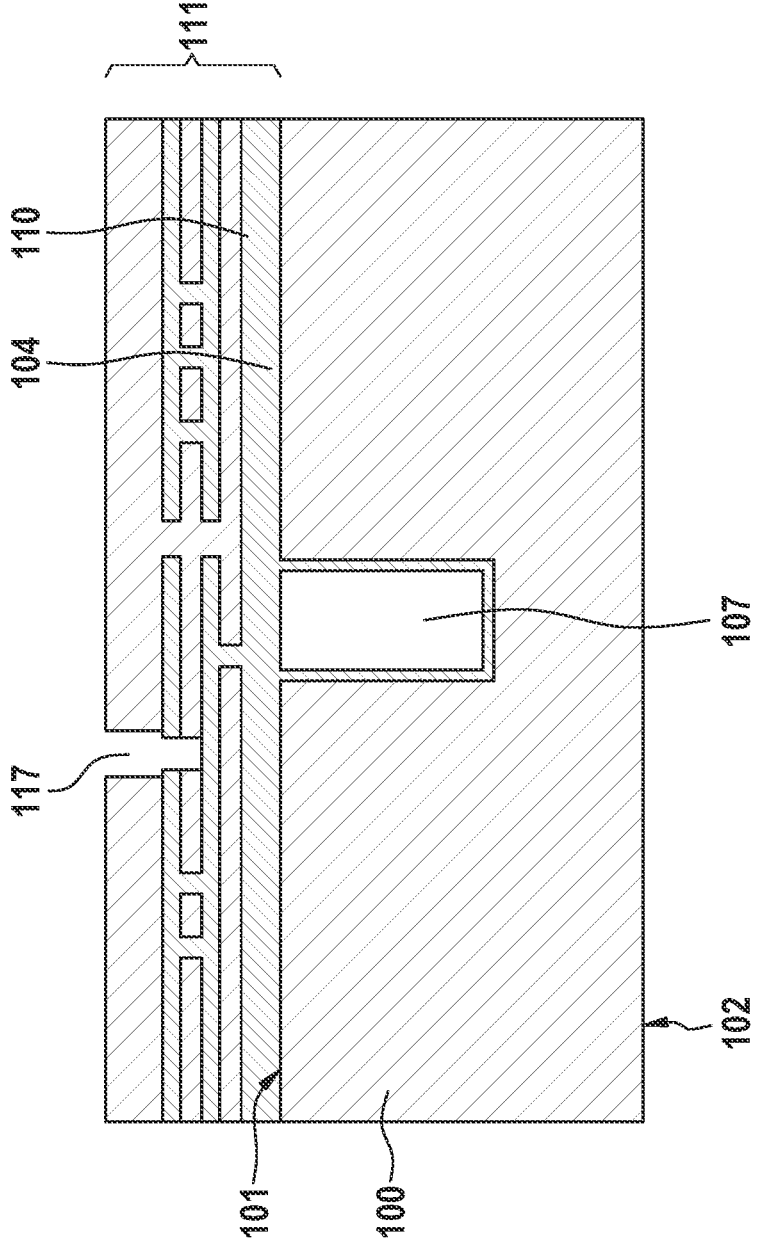

FIG. 5 shows a state temporally subsequent to FIG. 4. Similar or identical elements are provided with the same reference signs. Functional structures of the MEMS component 1 were formed by structuring the layer sequence 111. This can also be referred to as a function trench. The functional structures are, for example, masses, springs, electrodes or membranes, i.e. elements that fulfill elementary functions of the MEMS component 1. The functional structures are not shown in FIG. 5, since only a section of the MEMS component 1 is shown. FIG. 5 further shows that a first step for producing a ventilation access of the MEMS component 1 takes place. This done by a trench 117 being created in a side of the layer sequence 111 facing away from the upper side 101 of the first substrate 100 and in the region of the first blind hole 107.

Figure 6:
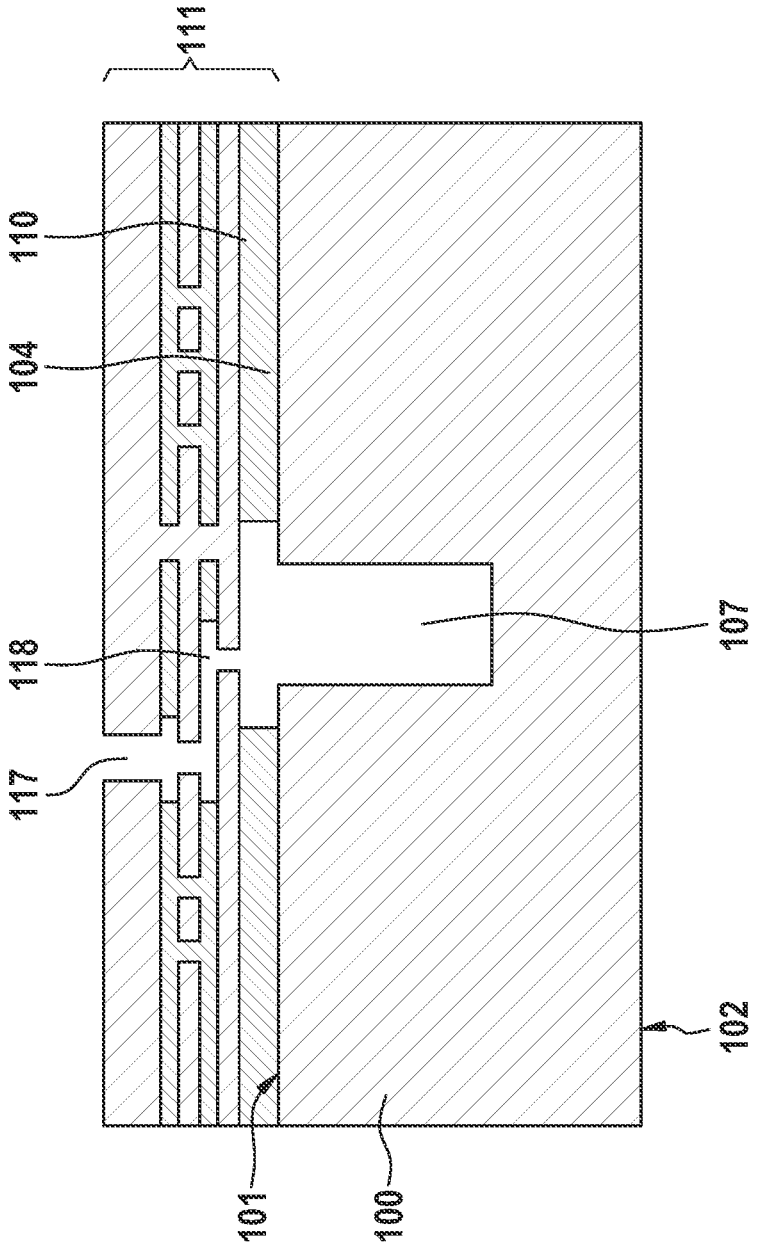

FIG. 6 shows a state temporally subsequent to FIG. 5. Similar or identical elements are provided with the same reference signs. In this state, the functional structures were exposed by means of an etching method, for example oxide etching, preferably by means of gas-phase etching, for example by means of gaseous hydrofluoric acid (HF), which in turn is not shown in FIG. 6 for the sake of simplicity. The exposure of the functional structures can be interpreted as a structuring of the layer sequence 111. In addition, a continuous connection was formed between the upper side 101 of the first substrate 100 and the trench 117. An access channel 118 extending through the layer sequence 111 to the first blind hole 107 has thus been formed.

FIG. 7 shows a state temporally subsequent to FIG. 6. Similar or identical elements are provided with the same reference signs. A second substrate 200 was arranged on a side of the layer sequence 111 facing away from the first substrate 100 and was connected to the first substrate 100. This step can also be referred to as a bonding process in which the first and the second substrate 100, 200 are connected or bonded to one another. This creates a bonded connection.

By way of example, the second substrate 200 comprises silicon, but can also comprise a different material. The second substrate 200 is planar and has an upper side 201, an underside 202 opposite the upper side 201, and a thickness 203 measured perpendicular to the upper side 201 of the second substrate 200. The second substrate 200 was arranged with its upper side 201 facing the first substrate 100. The substrate 200 can be designed as a wafer, for example. The second substrate 200 can also be referred to as a cap wafer. In the exemplary embodiment in FIG. 7, the second substrate 200 has on the upper side 201 facing the layer sequence 111 an application-specific integrated circuit (ASIC) 204 for operating the microelectromechanical component 1, in particular for controlling and/or reading the functional structures. The ASIC 204 comprises functional layers, not differentiated in more detail, for transistors and electrical conductor tracks and terminals or contacts. The ASIC 204 is preferably based on CMOS technology. However, the second substrate 200 can also fulfill only one cap function, without further functionality or with only a few rewiring planes, comprising, for example, polycrystalline silicon and/or a metal. The application-specific integrated circuit 204 can thus also be omitted.

The bonded connection can be, for example, a metallic or eutectic bonded connection, wherein a bonding frame is arranged between the first and second substrates 100, 200 and hermetically seals the exposed functional structures of the layer sequence 111 with respect to the environment. The bonded connection is not shown, since it is located outside the image section of FIG. 7. The functional structures of the microelectromechanical component 1 are thereby enclosed in a cavity 209 formed between the first substrate 100 and the second substrate 200. The cavity 209 is connected to the first blind hole 107 via the access channel 118.

FIG. 8 shows a state temporally subsequent to FIG. 7. Similar or identical elements are provided with the same reference signs. A second blind hole 119 was formed in the underside 102 of the first substrate 100 opposite the upper side 101 of the first substrate 100, and the first blind hole 107 was opened in the region of the second blind hole 119. The formation of the second blind hole 119, like the formation of the first blind hole 107, can be effected, for example, by means of a trench etch process. In the exemplary embodiment of the method, the first blind hole 107 was opened by the second blind hole 119 being designed such that it extends from the underside 102 of the first substrate 100 at least to the first blind hole 107. However, this is not absolutely necessary, as shown by a further embodiment within the context of the further description of the figures (see FIGS. 13 to 16).

The second blind hole 119 has a width 120 measured parallel to the underside 102 of the first substrate 100 and a depth 121 measured perpendicular to the underside 102 of the first substrate 100. The width 120 of the second blind hole 119 and the width of the first blind hole 107 relate to a cross-section of the blind holes 107, 119 and in each case correspond to a diameter in the case of circular blind holes 107, 119. In the exemplary embodiment, the width 120 of the second blind hole 119 is greater than the width 108 of the first blind hole, while the depth 121 of the second blind hole 119 is, for example, comparable with the depth of the first blind hole 107 or preferably even smaller. In other words, the second blind hole 119 has a larger opening area than the first blind hole 107. However, this is not mandatory. The second blind hole 119 can also have a opening area or width 120 smaller than the first blind hole 107.

The further dielectric layers 113, 115 of the layer sequence 111 can be used at least in sections as an etching stop 122 for the trench etch process or the formation of the second blind hole 119. Advantageously, the ASIC 204 is not influenced by an etching plasma during the trench etch process, since the etch stop 122 acts as a barrier for the etching plasma. Thus, on the one hand, the risk of plasma-induced damage to the ASIC 204 is greatly reduced, and on the other hand a full area of the ASIC 204 can be used over the entire area for circuit elements.

FIG. 9 shows a state temporally subsequent to FIG. 8. Similar or identical elements are provided with the same reference signs. In this state the MEMS component 1 has been completed. After evacuation of the cavity 209 or after introduction of a gas and subsequent setting of the internal cavity pressure from the underside 102 of the first substrate 100 and via the first blind hole 107, the first blind hole 107 was closed in the region of the second blind hole 119. The cavity 209 was thereby closed. By way of example, the first blind hole 107 was closed by means of laser reseal. In this case, the material of the first substrate 100 was locally melted in the region of the first blind hole 107 and the second blind hole 119 by using a suitable laser beam, so that a hermetic seal 123 forms on the surface (that is to say, in this case on the underside 102 of the first substrate 100), which in this case comprises resolidified silicon.

Figure 10:
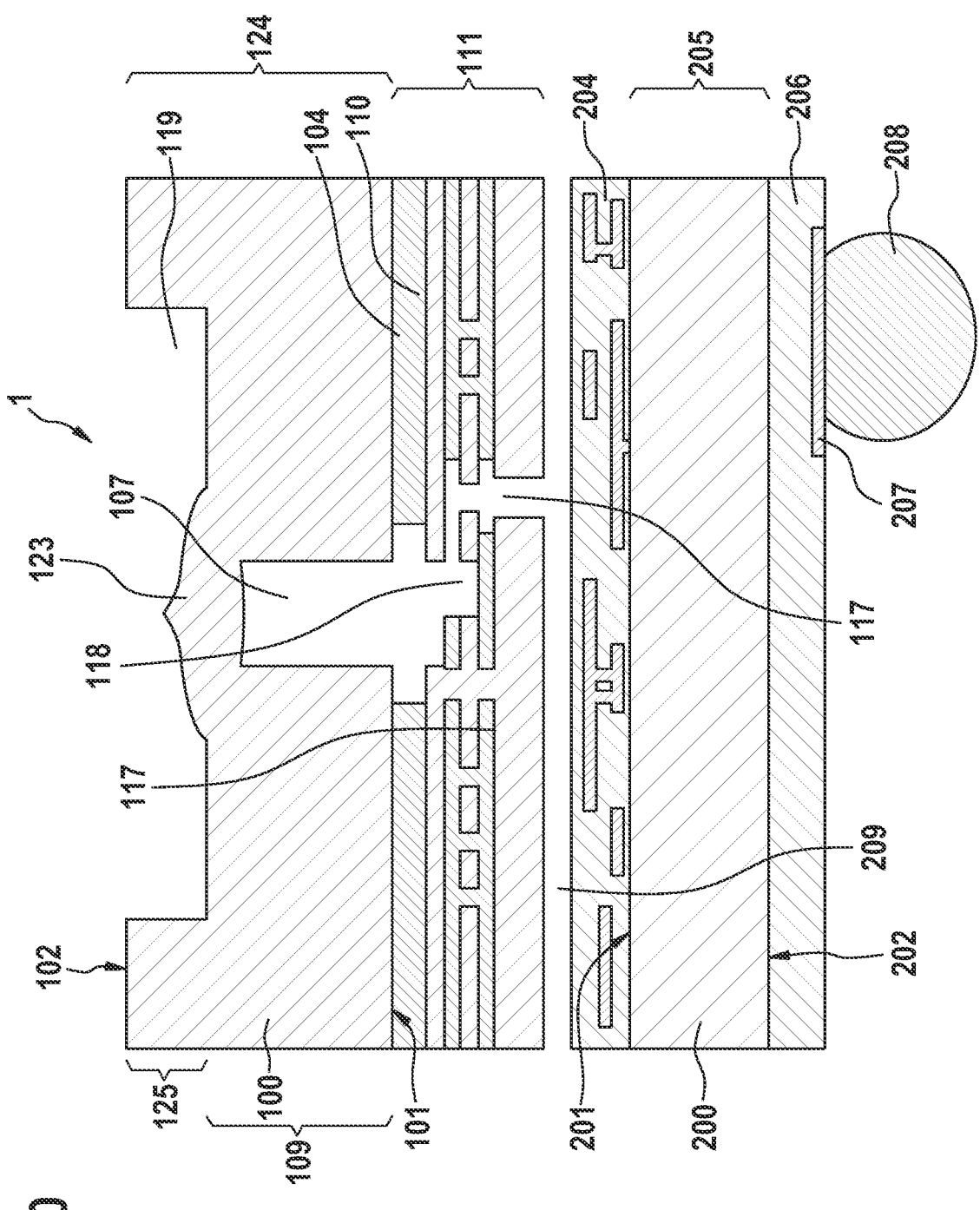

FIG. 10 shows a state temporally subsequent to FIG. 9. Similar or identical elements are provided with the same reference signs. The method steps shown in FIG. 10 are only optional. The second substrate 200 was thinned to its target thickness 124 by means of a grinding process and/or CMP. As a result, a remaining depth 125 of the second blind hole 119 is particularly small, and advantageously takes up a proportion of less than 50% of the remaining thickness 124 of the first substrate 100, particularly preferably less than 30% of the thickness 124. In other words, the remaining depth 125 of the second blind hole 119 is preferably less than the depth of the first blind hole 109. Due to the small remaining depth 125, less dirt can deposit in the second blind hole 119. Furthermore, the second substrate 200 was planarized on its underside 202 and thinned back to a target thickness 125. The first and second substrates 100, 200 can thus be significantly thinned back compared to a raw-wafer state. For example, the first substrate 100 can have a thickness 124 of 100 μm to 600 μm, and the second substrate 200 can have a thickness 205 of 60 μm to 120 μm after it has been ground and polished or planarized.

Through-silicon vias from the bottom 202 of the second substrate 200 were then applied (not shown in FIG. 10) since they are located outside the image region) in order to conduct ASIC signals to the underside 202 of the second substrate 200. However, it is also possible for the through-silicon vias to have already been applied in an earlier phase of ASIC processing and to merely need to be opened and contacted from the underside 202. In addition, a passivation layer was arranged on the underside 202 of the second substrate 200. At least one conductor-track plane 207 was arranged on a side of the passivation layer 206 facing away from the underside 202 of the second substrate 200. The ASIC 204 was provided with solder contacts 208, e.g. in the form of solder balls, which can be soldered to an electrical carrier, for example a printed circuit board, a semiconductor chip or a so-called interposer (intermediate element with vertical through-silicon vias). The MEMS component 1 is thus prepared for a printed circuit board mounting or surface mounting on a printed circuit board.

Figure 11:
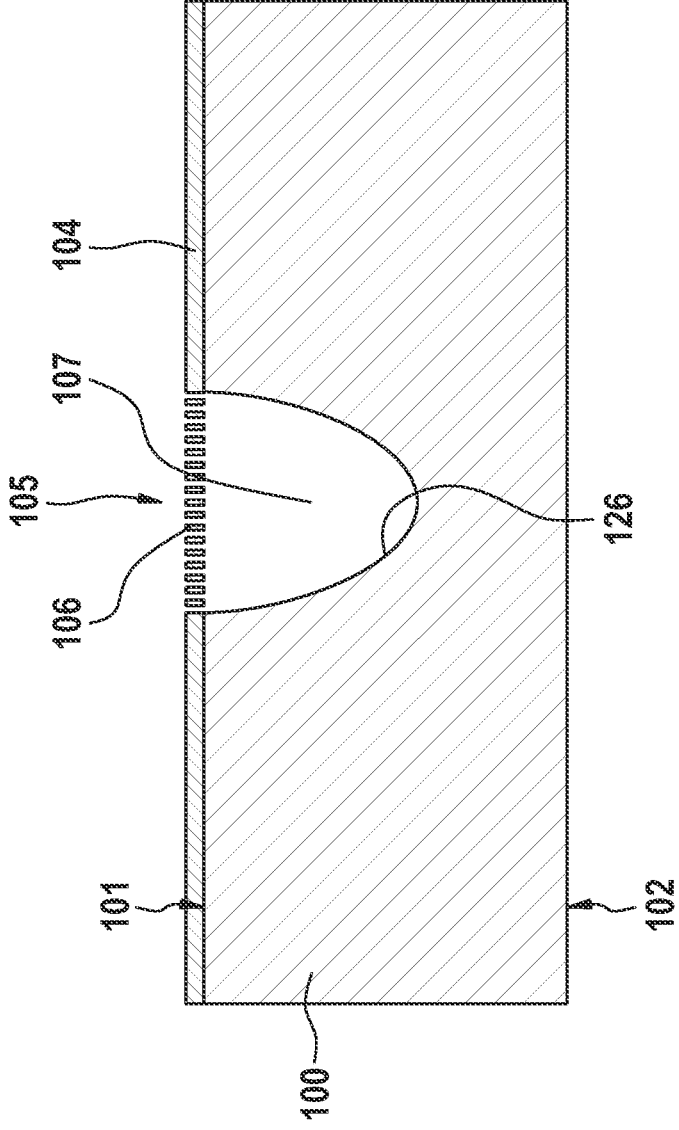
FIG. 11 and FIG. 12 show method steps of the method according to a second example embodiment of the present invention.
Figure 12:
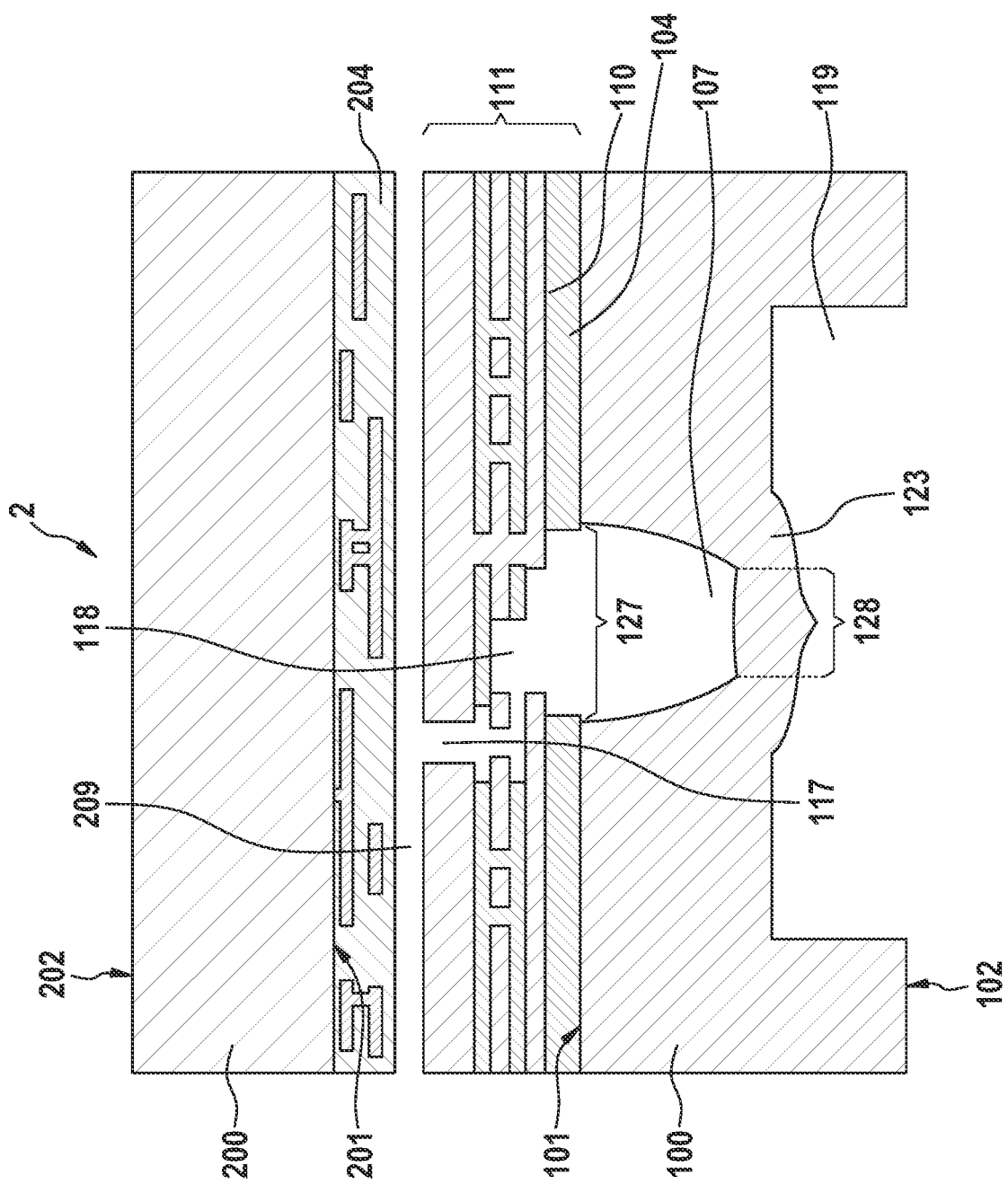

An alternative method is shown in FIGS. 11 and 12. In the following, only differences from the method in FIGS. 1 to 10 will be explained. FIG. 11 shows a state corresponding to FIG. 2. FIG. 12 shows a state corresponding to FIG. 9 and a MEMS component 2 according to a second embodiment. Similar or identical elements are provided with the same reference signs.

The essential difference from the method in FIGS. 1 to 10 is that, as shown in FIGS. 11 and 12, the first blind hole 107 is designed such that it tapers toward the underside 102 of the first substrate 100. In other words, the first blind hole 107 has sloping etching flanks or side walls 125. In the exemplary embodiment, the side walls 125 are curved, but this is not absolutely necessary. The first blind hole 107 thereby has a first width 127 in the region of the upper side 101 of the first substrate 100 and a second width 127 in the region of a bottom of the first blind hole 107, wherein the second width 128 is smaller than the first width 127. Due to the smaller second width 128, a more reliable closing of the first blind hole 107 is made possible, since the closure 123 of the first blind hole 107 is made smaller.

Figure 13:
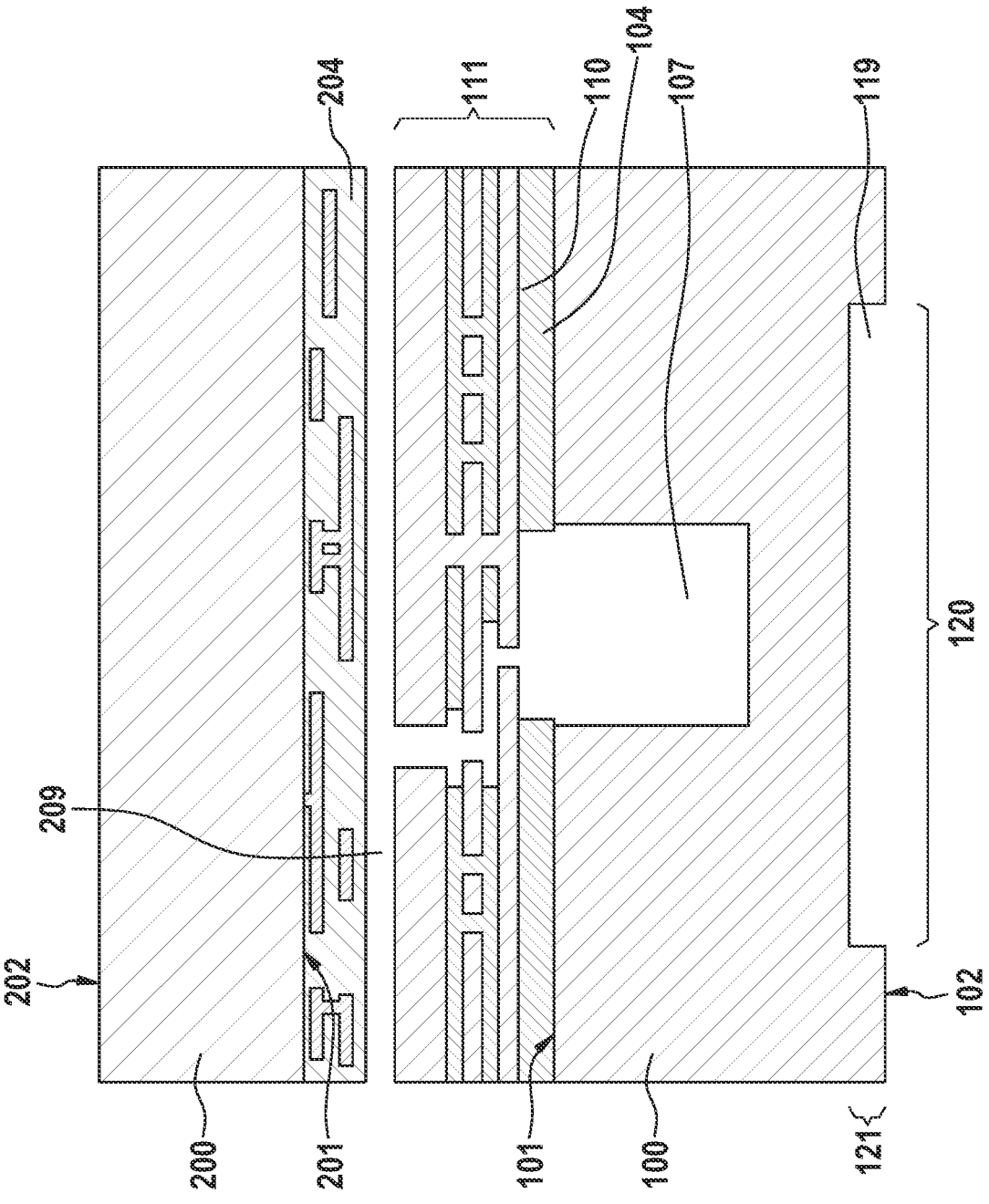
FIG. 13 to FIG. 16 show method steps of the method according to a third example embodiment of the present invention.
Figure 14:
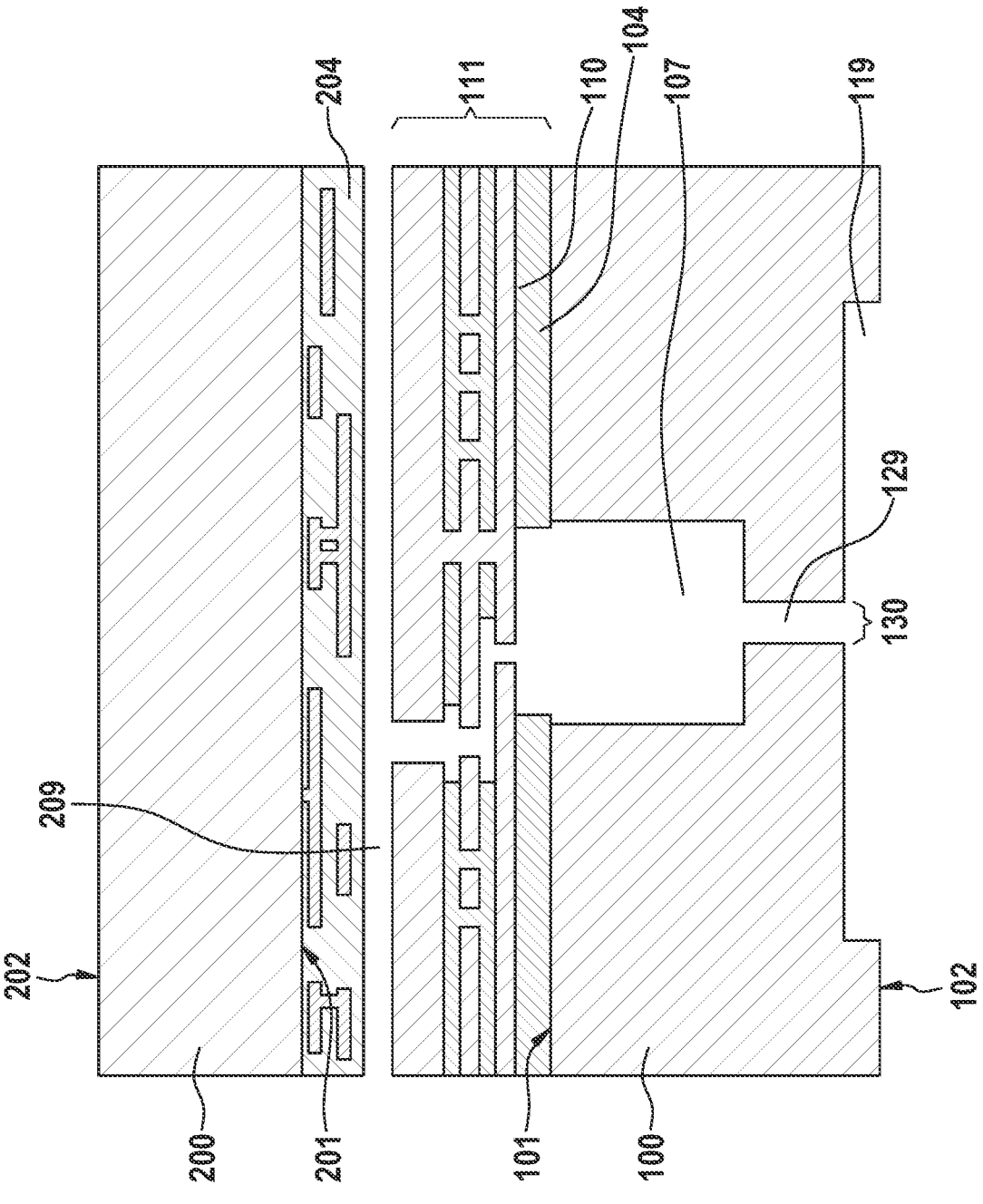
Figure 15:
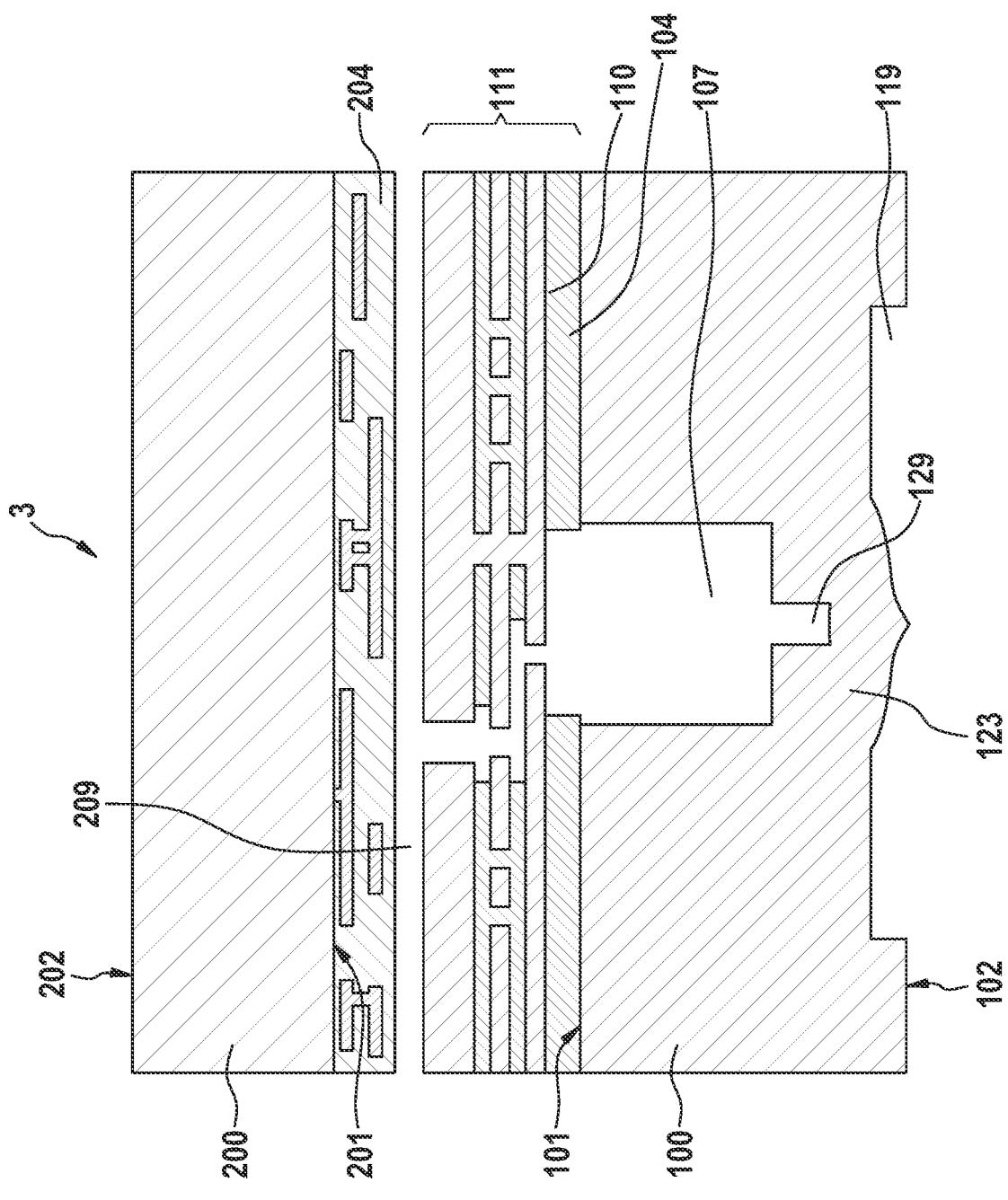
Figure 16:
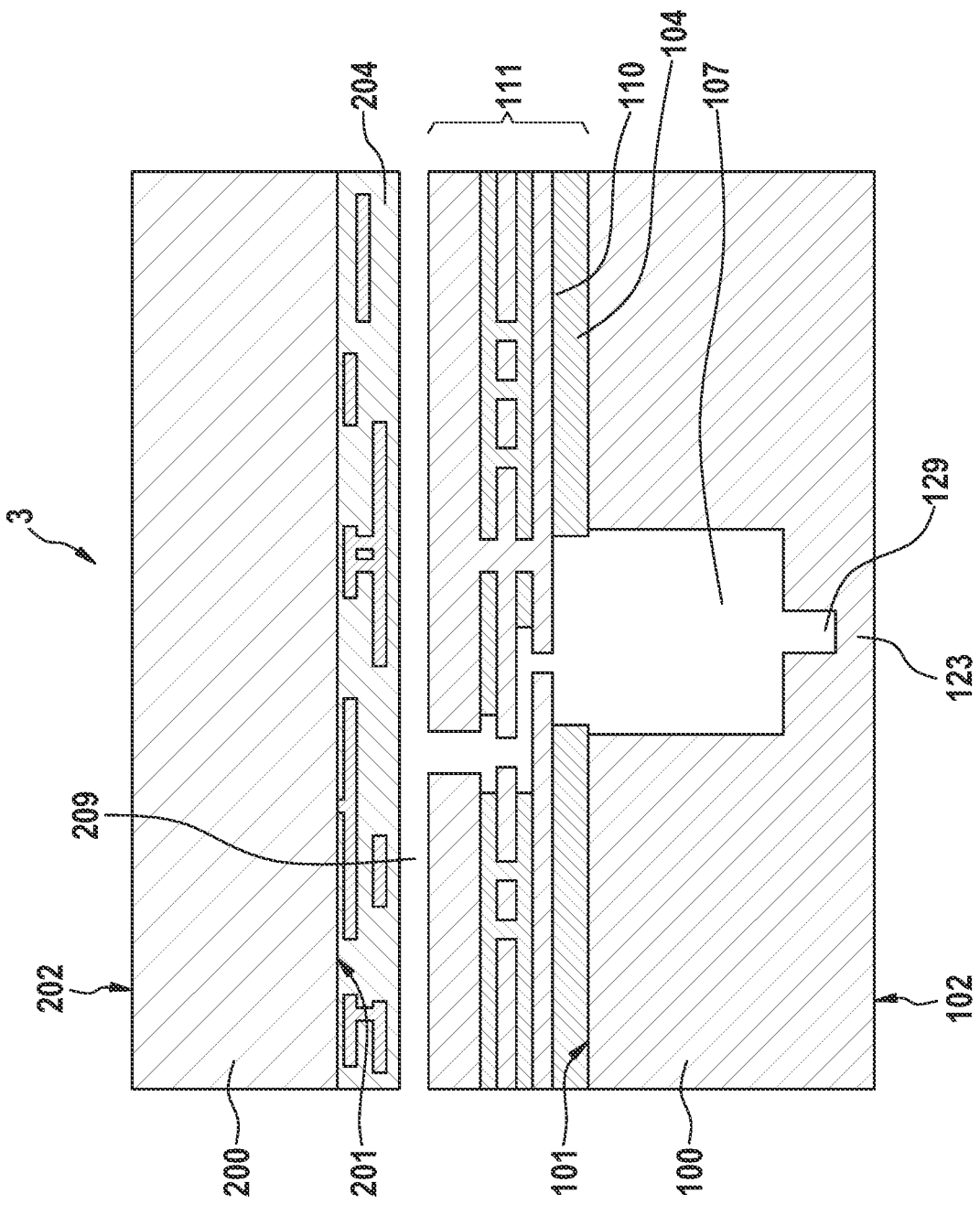

A further alternative method is shown in FIGS. 13 to 16. In the following, only differences from the method in FIGS. 1 to 10 will be explained. FIG. 13 shows a state corresponding to FIG. 8. FIG. 15 shows a state corresponding to FIG. 9 and a MEMS component 3 according to a third embodiment. FIG. 14 shows an additional intermediate state between the states in FIGS. 13 and 15. FIG. 16 shows a state corresponding to FIG. 10. Similar or identical elements are provided with the same reference signs.

FIG. 13 shows that, in contrast to FIG. 8, the second blind hole 119 has not been designed such that it extends from the underside 102 of the first substrate 100 to the first blind hole 107. The depth 121 of the second blind hole 119 was thus selected such that the first blind hole 107 is not opened by forming the second blind hole 119. FIG. 14 shows that instead the first blind hole 107 was opened by a through-opening 129 extending between the second blind hole 119 and the first blind hole 107 having been formed. The through-opening 129 thus connects the first and second blind holes 107, 119 to one another. A width 130 of the through-opening 129 is smaller than the width 108 of the first blind hole 107 and smaller than the width 130 of the second blind hole 119. Depending on the required etching depth, the width 130 can, for example, lie within a range of 5-10 μm, but is not limited thereto. Etching depths of, for example, 50-150 μm can thus be achieved in a safe and cost-efficient manner. Due to the through-opening 129 with a small width 130, a particularly reliable closure 123 can be formed, which is shown in FIG. 15. According to an optional planarization step, which is shown in FIG. 16, the MEMS component 3 can have a particularly topography-free underside 102 on the substrate side, and in particular no structures of the closure 123 are present which project from the underside 102 of the first substrate 100, which simplifies further processing.

Figure 17:
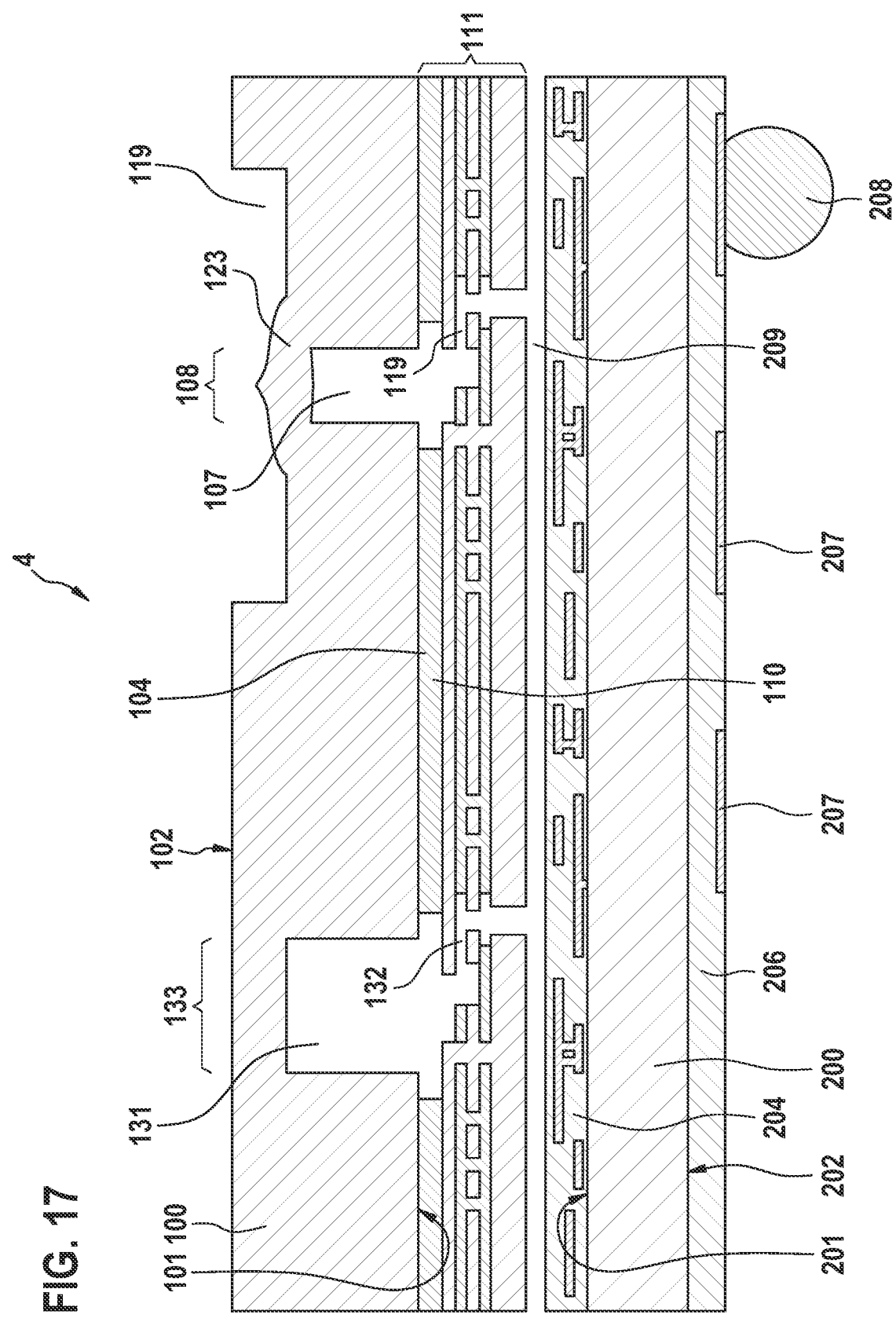
FIG. 17 shows a microelectromechanical component having an enlarged cavity volume, according to the present invention.

FIG. 17 schematically shows a MEMS component 4 according to a fourth embodiment. The MEMS component 4 has similarities with the MEMS component 1 according to FIG. 10. Only the differences will be explained below. Similar or identical elements are provided with the same reference signs.

During the production of the MEMS component 4 according to the fourth embodiment, the dielectric layer 104 was structured such that at least one further grating with further grating openings extending to the upper side 101 of the first substrate 100 was formed in the upper side 101 of the first substrate 100. The material of the first substrate 100 was removed in the region below the at least one further grating, whereby at least one further first blind hole 131 was formed in the upper side 101 of the first substrate 100. The further grating remained above the further first blind hole 131. By the arrangement of the cover layer 110, the further first blind hole 131 was closed. The layer sequence 111 was arranged above the closed further first blind hole 131. A further access channel 132 extending through the layer sequence 111 to the further first blind hole 131 was formed. The cavity 209 is thus connected to the further first blind hole 131 via the further access channel 132. The further first blind hole 131 is not opened. However, the further first blind hole 131 offers the advantage that a cavity volume of the cavity 209 is greater than in the case of the MEMS component 1 according to the first embodiment. As shown by way of example in FIG. 17, a width 133 of the further first blind hole can be greater than the width 108 of the first blind hole 107.

Figure 18:
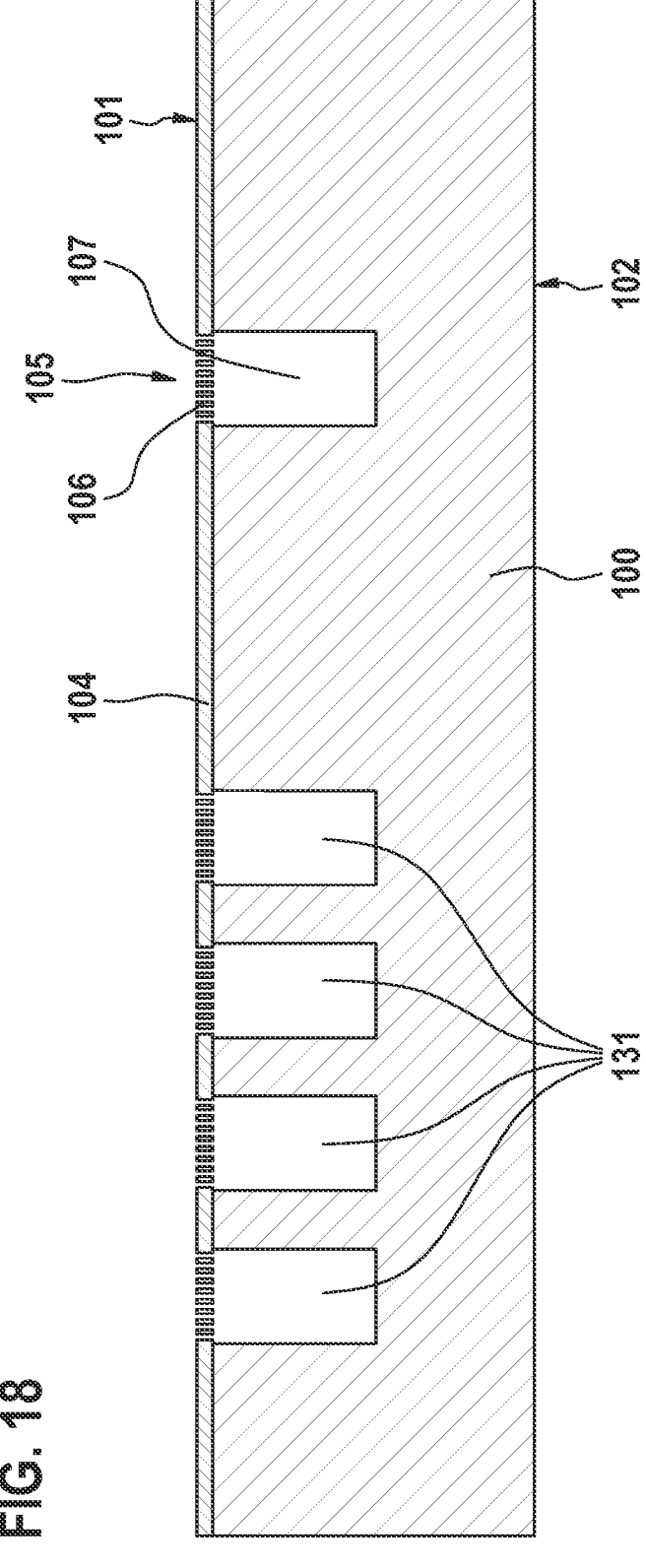
FIG. 18 to FIG. 21 show method steps of the method according to a fourth example embodiment of the present invention.
Figure 19:
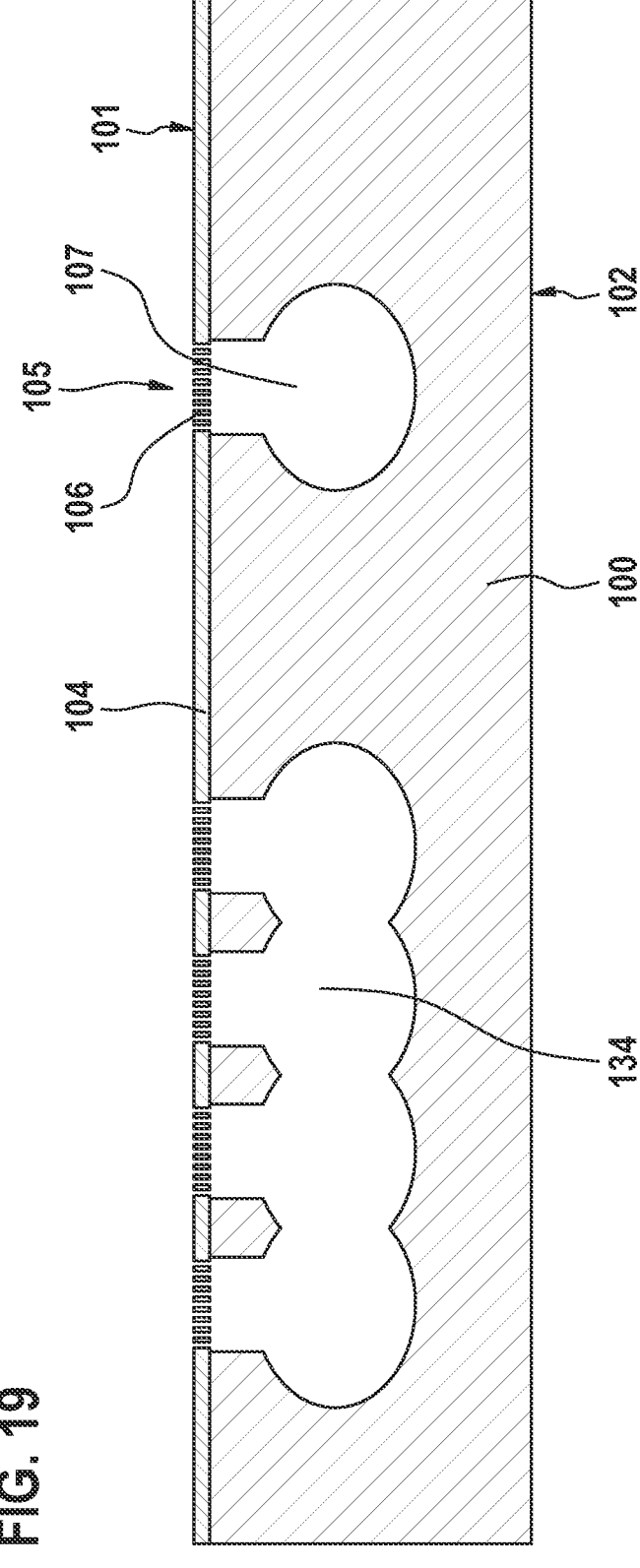
Figure 20:
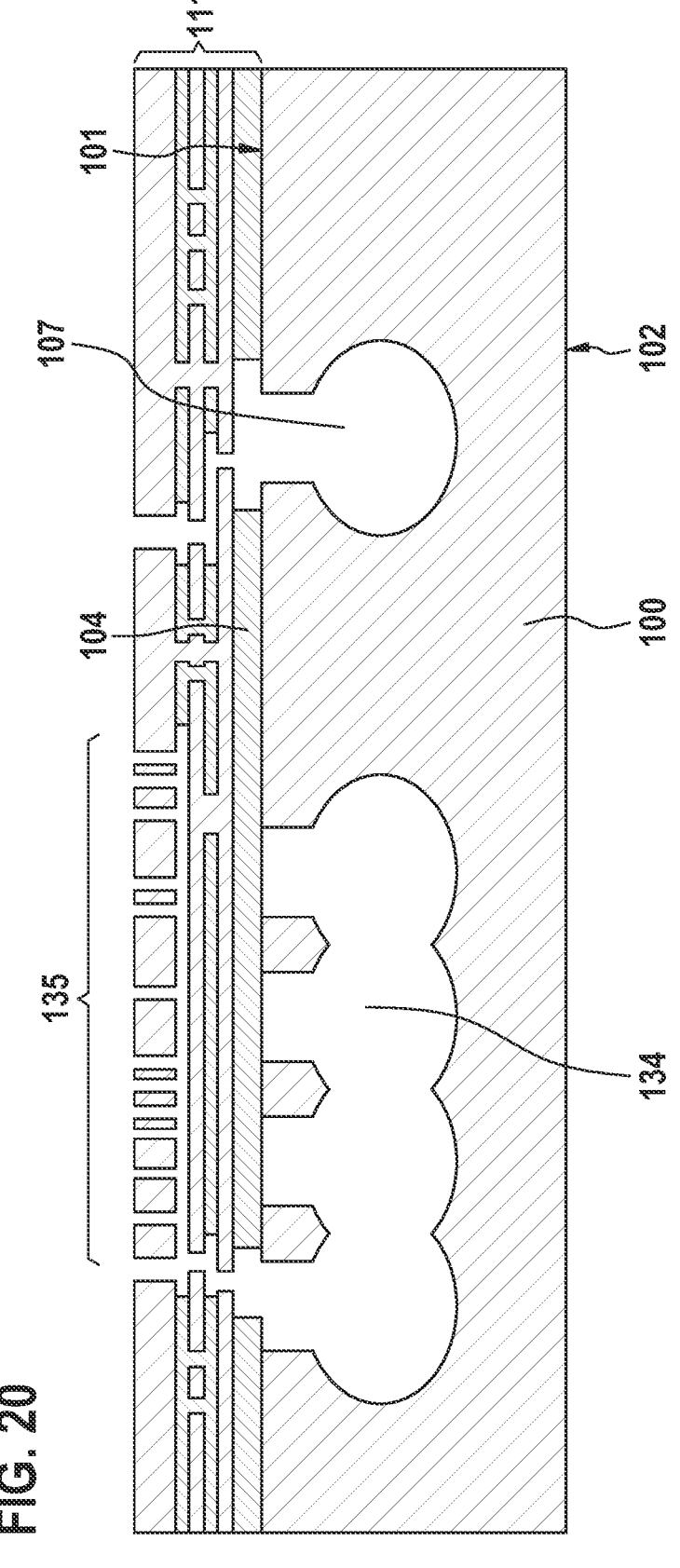
Figure 21:
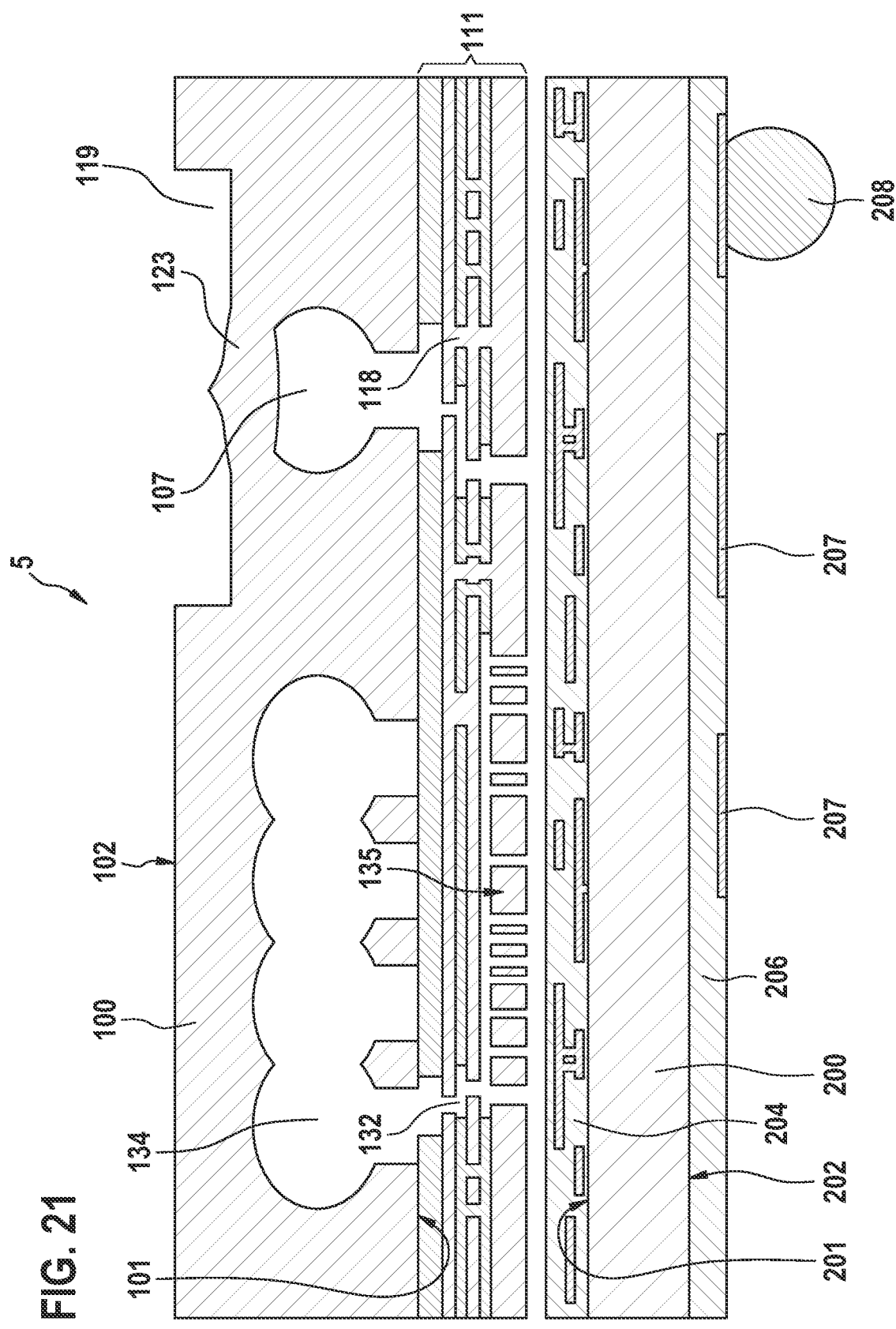

A further alternative method is shown in FIGS. 18 to 21. In the following, only differences from the method in FIGS. 1 to 10 will be explained. FIG. 18 shows a state corresponding to FIG. 2. FIG. 20 shows a state corresponding to FIG. 6. FIG. 19 shows an additional intermediate state between the states in FIGS. 18 and 20. FIG. 21 shows a state corresponding to FIG. 10 and a MEMS component 5 according to a fifth embodiment. Similar or identical elements are provided with the same reference signs.

FIG. 18 shows that, in addition to the first blind hole 107, a plurality of further first blind holes 131 arranged laterally next to one another was formed in the upper side 101 of the first substrate 101. FIG. 19 shows that the further first blind holes 131 were each laterally expanded in regions between the upper side 101 of the first substrate 100 and the corresponding bottoms of the further first blind holes 131 in such a way that a contiguous hollow space 134 was formed in the interior of the first substrate 100. A total cavity volume of the cavity 209 is further increased by the hollow space 134. The first blind hole 107 and the further first blind holes 131 can be formed, for example, by means of an isotropic etching process, while the further first blind holes 131 can be expanded, i.e. the hollow space 134 can be formed, by means of an anisotropic etching process.

FIG. 20 shows that functional structures 135 of the microelectromechanical component 5 were designed and exposed by way of example in a region above the hollow space 134. In these regions the functional structures 135 are thus not connected to the first substrate 100. In this way, effective stress decoupling can be achieved with respect to mechanical stress which can be transmitted from the first substrate 100 to the functional structures 135.

It goes without saying that not only can the method according to the invention be used to open and close a cavity in a MEMS component 1, 2, 3, 4, 5, but it can also be used to open in parallel and sequentially close two or more cavity regions that are separated from one another (for example, by means of a bonding frame). A defined internal pressure and a defined gas type can be used in each of the cavity regions, wherein internal pressure and/or gas type can differ from one another in the different cavities.

The invention can be used in connection with smartphones and tablets, wearables, hearables, AR and VR, drones, gaming and toys, robots, the smart home, and in the industrial context, amongst other things for the following applications: wake-up functions for selected device modules, detection of device orientation, screen orientation and display orientation, detection of a significant movement, shock and free-fall detection; HMI (human-machine interface) functionality, e.g. multi-tap detection, activity, gesture, and context recognition, user recognition, movement control, Cardan system, height and position stabilization, dynamic route planning, flight control, image stabilization, indoor and outdoor navigation, floor recognition, position tracking and route recording, PDR (pedestrian dead reckoning), dynamic route planning, detection of boundaries and obstacles, indoor SLAM (simultaneous localization and map creation); intrusion monitoring, real-time movement recognition and tracking, dynamic route planning, activity tracking, pedometer, calorie counter, sleep monitoring; detection of the wearing state of hearables (in-ear/out-of-ear detection), determination of head orientation and head movement; logistics, parts tracking, energy management and energy-saving measurement, predictive maintenance; monitoring of air quality and climate, mold detection, water-level detection; sensor data fusion.

The invention can furthermore be used in connection with automobile applications: crash detection, e.g. in airbag systems; electronic stability program (ESP), vehicle dynamics control (VDC); hill start assist, hill hold control (prevention of rolling back when starting off on inclines); suspension control; smart tires, e.g., road condition monitoring; navigation applications; autonomous driving; theft detection, alarm functions; monitoring tailgate tilt; optimization of engine control and of the combustion process in gasoline or diesel engines.

What is claimed is:

1. A method for producing a microelectromechanical component, comprising the following steps:

arranging a dielectric layer on an upper side of a first substrate;

structuring the dielectric layer, wherein a grating with grating openings extending to the upper side of the first substrate is formed in the dielectric layer;

removing a material of the first substrate in a region below the grating, forming a first blind hole in the upper side of the first substrate, wherein the grating remains above the first blind hole;

arranging a cover layer on a side of the dielectric layer facing away from the first substrate, closing the first blind hole;

arranging a layer sequence on a side of the cover layer facing away from the first substrate and above the closed first blind hole;

forming and exposing functional structures of the microelectromechanical component by structuring the layer sequence;

forming an access channel extending through the layer sequence to the first blind hole;

arranging a second substrate on a side of the layer sequence facing away from the first substrate and connecting the first substrate and the second substrate, wherein the functional structures of the microelectromechanical component are enclosed in a cavity formed between the first substrate and the second substrate, and the cavity is connected to the first blind hole via the access channel;

forming a second blind hole on an underside of the first substrate opposite the upper side and opening the first blind hole in a region of the second blind hole; and setting a cavity internal pressure in the cavity and closing the first blind hole in the region of the second blind hole.

2. The method according to claim 1, wherein the first blind hole is opened by the second blind hole being configured such that the second blind hole extends from the underside of the first substrate at least to the first blind hole.

3. The method according to claim 2, wherein the first blind hole is configured such that the first blind hole tapers toward the underside of the first substrate.

4. The method according to claim 1, wherein the first blind hole is opened by formation of a through-opening extending between the second blind hole and the first blind hole.

5. The method according to claim 1, wherein the second blind hole has a smaller opening area than the first blind hole.

6. The method according to claim 1, wherein the first substrate is planarized on the underside: (i) at least partially before the second blind hole is formed, and/or (ii) at least partially after the first blind hole has been closed.

7. The method according to claim 1, wherein the second substrate has an application-specific integrated circuit configured to operate the microelectromechanical component on a side facing the layer sequence.

8. The method according to claim 1, wherein:

the dielectric layer is structured such that at least one further grating with further grating openings extending to the upper side of the first substrate is formed in the upper side of the first substrate, the material of the first substrate is removed in the region below the at least one further grating forming at least one further first blind hole in the upper side of the first substrate, the further grating remains above the further first blind hole, the further first blind hole is closed by the arrangement of the cover layer,

14 the layer sequence is arranged above the closed further first blind hole, a further access channel extending through the layer sequence to the further first blind hole is formed, and the cavity is connected to the further first blind hole via the further access channel.

9. The method according to claim 8, wherein:

a plurality of further first blind holes arranged laterally next to one another is formed in the upper side of the first substrate, and the further first blind holes are each laterally expanded in regions between the upper side of the first substrate and corresponding bottoms of the further first blind holes in such a way that a contiguous hollow space is formed in an interior of the first substrate.

10. The method according to claim 9, wherein:

the further first blind holes are formed using an isotropic etching process, and the further first blind holes are expanded using an anisotropic etching process.

11. The method according to claim 9, wherein the functional structures of the microelectromechanical component are formed and exposed in a region above the hollow space.

12. The method according to claim 1, wherein:

the dielectric layer is structured such that at least one additional grating with additional grating openings extending to the upper side of the first substrate is formed in the upper side of the first substrate, the material of the first substrate is removed in the region beneath the at least one additional grating forming at least one additional first blind hole in the upper side of the first substrate, the additional grating remains above the additional first blind hole, the additional first blind hole is closed by the arrangement of the cover layer, the layer sequence is arranged above the closed additional first blind hole, additional functional structures of the microelectromechanical component are formed and exposed by structuring the layer sequence, an additional access channel extending through the layer sequence to the additional first blind hole is formed, the additional functional structures of the microelectromechanical component are enclosed in an additional cavity that is formed between the first substrate and the second substrate and is separate from the cavity, and the additional cavity is connected to the additional first blind hole via the additional access channel, an additional second blind hole is formed in the underside of the first substrate and the additional first blind hole is opened in a region of the additional second blind hole, and an additional cavity internal pressure in the additional cavity is set and the additional first blind hole is closed in the region of the additional second blind hole.

* * * * *